(12) United States Patent
Yoo et al.

(10) Patent No.: US 9,348,679 B2
(45) Date of Patent: May 24, 2016

(54) DRAM CONTROLLER HAVING DRAM BAD PAGE MANAGEMENT FUNCTION AND BAD PAGE MANAGEMENT METHOD THEREOF

(71) Applicant: Samsung Electronics Co., Ltd., Suwon-si (KR)

(72) Inventors: Jun Hee Yoo, Gyeonggi-do (KR); Sung Hyun Lee, Gyeonggi-do (KR); Dongsoo Kang, Gyeonggi-do (KR); Sua Kim, Gyeonggi-do (KR); Haksoo Yu, Gyeonggi-do (KR); Jaeyoun Youn, Seoul (KR); Hyojin Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 103 days.

(21) Appl. No.: 14/465,105

(22) Filed: Aug. 21, 2014

(65) Prior Publication Data

US 2015/0067248 A1    Mar. 5, 2015

(30) Foreign Application Priority Data

Aug. 30, 2013 (KR) ........................ 10-2013-0104373

(51) Int. Cl.
| | | |
|---|---|---|
| *G06F 11/10* | (2006.01) | |
| *G06F 11/00* | (2006.01) | |
| *G11C 8/06* | (2006.01) | |
| *G11C 11/401* | (2006.01) | |
| *G11C 29/44* | (2006.01) | |

(52) U.S. Cl.
CPC ......... *G06F 11/00* (2013.01); *G11C 8/06* (2013.01); *G11C 11/401* (2013.01); *G11C 2029/4402* (2013.01)

(58) Field of Classification Search
CPC .................. G06F 11/00; G11C 11/401; G11C 2029/4402
USPC ............................................... 711/105
See application file for complete search history.

(56) References Cited

U.S. PATENT DOCUMENTS

| | | |
|---|---|---|
| 6,260,156 B1 | 7/2001 | Garvin et al. |
| 6,285,607 B1 * | 9/2001 | Sinclair .................. G11C 29/88 365/189.15 |
| 7,366,825 B2 | 4/2008 | Williams et al. |
| 7,434,122 B2 | 10/2008 | Jo |
| 7,472,331 B2 | 12/2008 | Kim |
| 7,603,593 B2 | 10/2009 | Iaculo et al. |
| 7,690,031 B2 | 3/2010 | Ma et al. |
| 7,721,146 B2 | 5/2010 | Polisetti et al. |
| 7,990,797 B2 | 8/2011 | Moshayedi et al. |

(Continued)

OTHER PUBLICATIONS

Chin-Hsien Wu, A Bad-Block Test Design for Multiple Flash-Memory Chips, Journal of Information Science and Engineering 28, 1091-1104 (2012).

(Continued)

*Primary Examiner* — Jae Yu
(74) *Attorney, Agent, or Firm* — Onello & Mello, LLP

(57) ABSTRACT

A bad page management system is provided to guarantee a yield of a volatile semiconductor memory device such as a DRAM. A bad page list exists in a DRAM. A page remapper in a memory controller performs a page remapping operation in parallel with a normal operation of a scheduling unit to perform a latency overhead hidden function. A chip size of the DRAM is reduced or minimized. A DRAM controller performs a latency overhead hidden function to control a DRAM.

20 Claims, 19 Drawing Sheets

(56) References Cited

U.S. PATENT DOCUMENTS

| | | |
|---|---|---|
| 8,046,645 B2 | 10/2011 | Hsu et al. |
| 8,156,392 B2 | 4/2012 | Flynn et al. |
| 8,185,685 B2 | 5/2012 | Selinger |
| 2010/0042774 A1 | 2/2010 | Yang et al. |
| 2012/0284469 A1 | 11/2012 | Seo |
| 2013/0055048 A1 | 2/2013 | Yu et al. |

OTHER PUBLICATIONS

Atsushi Inoue, Doug Wong, NAND Flash Applications Design Guide, Toshiba America Electronic Components, Inc. Revision 1.0 Apr. 2003, pp. 1-29.

Onur Mutlu, Thomas Moscibroda, Parallelism-Aware Batch Scheduling: Enhancing both Performance and Fairness of Shared DRAM Systems; International Symposium on Computer Architecture; IEEE (2008), pp. 63-74.

Gaurav Dhiman, Raid Ayoub, Tajana Rosing, PDRAM: A Hybrid PRAM and DRAM Main Memory System, Department of Computer Science and Engineering, University of California, San Diego, La Jolla, CA 92093-0404; Design Automation Conference DAC '09. 46th ACM/IEEE (2009), pp. 664-669.

Stephen Harris, Selecting and Implementing NAND Flash Mass Storage Solutions for Embedded Applications, Embedded.com (http://www.embedded.com) Cypress Perform (2008), pp. 1-4.

* cited by examiner

Fig. 14

| Total pages | Number of sets | Width per set | Table size (Kbit) |
|---|---|---|---|
| 65536 | 64 | 177 | 11328 |
| 131072 | 128 | 177 | 22656 |
| 262144 | 256 | 177 | 45312 |
| 524288 | 512 | 177 | 90624 |
| 1048576 | 1024 | 177 | 181248 |

DRAM CONTROLLER HAVING DRAM BAD PAGE MANAGEMENT FUNCTION AND BAD PAGE MANAGEMENT METHOD THEREOF

CROSS-REFERENCE TO RELATED APPLICATIONS

This U.S. non-provisional patent application claims priority under 35 U.S.C. §119 to Korean Patent Application No. 10-2013-0104373, filed on Aug. 30, 2013 in the Korean Intellectual Property Office, the contents of which are herein incorporated by reference in their entirety.

BACKGROUND OF THE INVENTION

The present inventive concepts relate to a memory system including a controller and a semiconductor memory device. More particularly, the present inventive concepts relate to a memory controller having a memory bad page management function and a bad page management method thereof.

In a semiconductor memory device, if even one of a plurality of memory cells has a flaw, the semiconductor memory device cannot perform a desired function and is treated as a defective product. However, when only a small number of memory cells have flaws, it is inefficient to treat the semiconductor memory device as a defective product, the yield is decreased.

In order to prevent this problem, a semiconductor memory device may include a spare memory cell block having spare memory cells. When defects occur in normal memory cells of a normal memory cell block, failed memory cells are replaced with spare memory cells in the spare memory cell block and, thereby, the semiconductor memory device is not treated as a defective product.

Failed memory cells of the semiconductor memory device may be replaced with spare memory cells from the spare memory cell block by a row/column unit. An anti-fuse usually may be used as a program device which stores fail addresses to perform replacement work. For example, if failed memory cells are found in the semiconductor memory device during a wafer test, after a wafer process is completed, a fail address indicating an address of a failed memory cell is programmed by rupturing anti-fuses. Thus, when a row/column address accessing a failed memory cell is input, a row/column of a spare memory cell in the spare memory cell block is activated instead of the failed memory cell by using information programmed in the anti-fuses or an e-fuse.

A page of a memory cell array in a memory such as a DRAM may mean a word line. Thus, a page address means a row address for accessing a word line. If a page address is applied to a DRAM and, thereby, a word line is activated, memory cells connected to the page address are all accessed. An access operation includes an operation of enabling a word line connected to memory cells for a read or write operation of a memory cell.

If a failed memory cell is found in a DRAM during testing, a word line connected to the failed memory cell is managed as a bad page. Bad page management includes a redundancy scheme in which, after a bad page address is programmed using an anti-fuse or an e-fuse and the programmed bad page address is stored in an internal latch circuit, when a DRAM is powered up, a spare page is accessed instead of the bad page when an external input address indicating an address of the bad page is applied to the DRAM.

Including a latch circuit and a functional circuit for performing a redundancy scheme, as described above, in a DRAM causes an overhead of a chip size of the DRAM.

In a nonvolatile semiconductor memory device such as a flash memory, a controller may perform a function of managing a bad page. However, since latency of a data input/output operation of a DRAM is very performance-critical, it is inappropriate to apply technologies adopted by a controller of a nonvolatile semiconductor memory device to a volatile memory device.

SUMMARY

According to an aspect of the present inventive concepts, there is provided a bad page management method of a memory. The bad page management method may include receiving bad page information indicating a page address of a failed memory cell from a memory such as a DRAM in response a system being powered up; providing a lookup table on the basis of the received bad page information; and remapping bad pages of the DRAM according to the provided lookup table in parallel with a precharge operation of the DRAM performed in a normal operation of a memory controller.

In some embodiments, the bad page information comprises a defective row address of the DRAM.

In some embodiments, when the remapping operation is performed, when an input address coincides with an address in the lookup table which is indicated as a defective address in the lookup table, a remapping address is obtained from the lookup table and is output as an output address of the memory controller, and, when an input address does not coincide with an address which is indicated as a defective address in the lookup table, the input address is output as the output address of the memory controller.

In some embodiments, the remapping address indicates an address of a spare page to be accessed instead of the bad page.

In some embodiments, the lookup table has a set overflow bit at every bad page and a memory row size of the lookup table is determined by a set associative value.

In some embodiments, in the lookup table, in the case that the number of occurrence of the bad pages exceeds the set associative value, a next row confirm flag bit is provided for indicating that the number of bad pages exceeds a set associative value by a row unit.

In some embodiments, the lookup table is comprises a SRAM or a register file.

According to another aspect of the present inventive concepts, there is provides a DRAM controller. The DRAM controller may include a bad page management unit. The bad page management unit comprises a scheduling unit generating a command and an address to access a DRAM; and a page remapper which operates in parallel with a normal operation of the scheduling unit and receives bad page information indicating a page address of a failed memory cell from the DRAM in a system boot up operation to remap bad pages of the DRAM.

In some embodiments, the page remapper includes a lookup table for storing and managing the bad page information; an address generator receiving an input address to generate an internal address for an address remapping; a comparing unit comparing a part of the internal address with an address being output from the lookup table; and a hit/miss logic selectively outputting a remapping address or the input address according to a comparison output of the comparing unit.

In some embodiments, the hit/miss logic outputs the remapping address as an output address when the comparison output of the comparing unit indicates a bad page hit, and the input address bypasses to the output when the comparison output of the comparing unit indicates a bad page miss.

In some embodiments, the remapping address or the input address is provided to the scheduling unit.

In some embodiments, the lookup table has a set overflow bit at every bad page.

In some embodiments, a memory size of the lookup table is determined according to the number of spare pages being set.

In some embodiments, a memory row size of the lookup table is determined according to a set associative value.

In some embodiments, when the number of bad pages occurred exceeds a set associative value, the lookup table further comprises a next row confirm flag bit for indicating that the number of bad pages exceeds the set associative value by a row unit.

According to another aspect of the present inventive concepts, there is provided a memory system. The memory system may include a memory comprising a memory cell array and a bad page listing unit storing bad page information indicating a page address of a failed memory cell in the memory cell array; and a memory controller comprising a bad page management unit comprising a scheduling unit generating a command and an address to access the memory and a page remapper which receives the bad page information from the bad page listing unit in a system initialization operation to remap bad pages of the memory. The page remapper operates in parallel with the scheduling unit in a normal operation of the scheduling unit.

In some embodiments, the bad page listing unit of the memory comprises at least one of a nonvolatile memory, an antifuse circuit, and an e-fuse circuit.

In some embodiments, when the memory controller controls a precharge operation of the memory, the page remapper performs a remapping operation on bad pages of the memory in parallel with the precharge operation of the memory.

In some embodiments, the remapping operation is finished before an active operation of the memory begins.

In some embodiments, the page remapper includes a lookup table for storing and managing the bad page information; an address generator receiving an input address to generate an internal address for an address remapping; a comparing unit comparing a part of the internal address with an address being output from the lookup table; and a hit/miss logic selectively outputting one of a remapping address and the input address according to a comparison output of the comparing unit.

In some embodiments, the lookup table has a set overflow bit at every bad page.

In some embodiments, a memory row size of the lookup table is determined according to a set associative value.

In some embodiments, when the number of bad pages exceeds a set associative value, the lookup table further comprises a next row confirm flag bit for indicating that the number of bad pages exceeds a set associative value by a row unit.

According to another aspect of the present inventive concepts, there is provided a DRAM controller. The DRAM controller may include a bad page management unit. The bad page management unit comprises a scheduling unit for accessing a DRAM; and a page remapper includes a lookup table for storing and managing bad page information of the DRAM. The page remapper operates in parallel with the scheduling unit to perform a latency overhead hidden function and receives the bad page information to remap bad pages of the DRAM.

In some embodiments, the page remapper includes an address generator receiving an input address to generate an internal address for an address remapping; a comparing unit comparing a part of the internal address with an address being output from the lookup table; and a hit/miss logic selectively outputting one of a remapping address and the input address according to a comparison output of the comparing unit.

In some embodiments, the hit/miss logic outputs the remapping address as an output address when the comparison output of the comparing unit indicates a bad page hit, and the input address bypasses to the output when the comparison output of the comparing unit indicates a bad page miss.

In some embodiments, a memory size of the lookup table is determined according to the number of spare pages being set.

In some embodiments, a memory row size of the lookup table is determined according to a set associative value.

In some embodiment, the lookup table comprises at least one of a SRAM, a MRAM, and a register file.

According to another aspect of the present inventive concepts, there is provided a memory system including a DRAM including a memory cell array; and a DRAM controller. The DRAM controller includes a bad page management unit including a scheduling unit generating a command and an address to access the DRAM and a page remapper which operates in parallel with a normal operation of the scheduling unit and receives bad page information indicating a page address of a failed memory cell from the DRAM in a system boot up operation to remap bad pages of the DRAM.

In some embodiments, when the DRAM controller controls a precharge operation of the DRAM, the page remapper performs a remapping operation on bad pages of the DRAM in parallel with the precharge operation of the DRAM.

In some embodiments, the remapping operation is finished before an active operation of the DRAM begins.

In some embodiments, the page remapper includes a lookup table for storing and managing the bad page information; an address generator receiving an input address to generate an internal address for an address remapping; a comparing unit comparing a part of the internal address with an address being output from the lookup table; and a hit/miss logic selectively outputting one of a remapping address and the input address according to a comparison output of the comparing unit.

In some embodiments, the lookup table has a set overflow bit at every bad page.

In some embodiments, a memory row size of the lookup table is determined according to a set associative value and, when the number of bad pages exceeds a set associative value, the lookup table further comprises a next row confirm flag bit for indicating that the number of bad pages exceeds a set associative value by a row unit.

BRIEF DESCRIPTION OF THE FIGURES

The foregoing and other features and advantages of the inventive concepts will be apparent from the more particular description of embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

FIG. 14 is a table illustrating an overhead when generating the lookup table of FIG. 3.

DETAILED DESCRIPTION OF PREFERRED EMBODIMENTS

Figure 1:
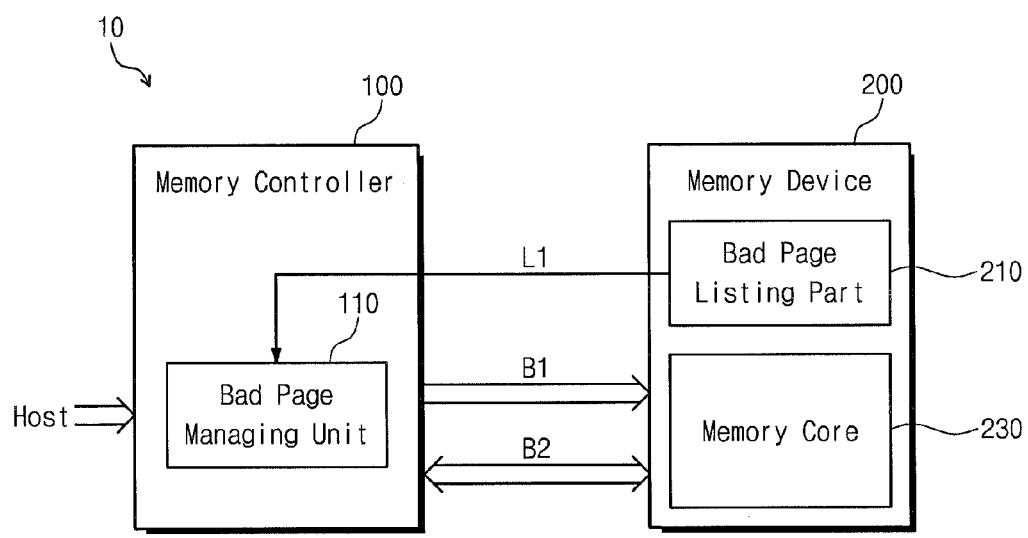
FIG. 1 is a schematic block diagram of a memory system in accordance with an example embodiment of the present inventive concepts.

Various example embodiments will be described more fully hereinafter with reference to the accompanying drawings, in which some example embodiments are shown. The present inventive concepts may, however, be embodied in many different forms and should not be construed as limited to the example embodiments set forth herein.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

FIG. 1 is a schematic block diagram of a memory system 10 in accordance with an example embodiment of the present inventive concepts.

Referring to FIG. 1, the memory system 10 includes a memory controller 100 and a memory device 200, for example, a dynamic random access memory (DRAM).

The DRAM 200 includes a memory core 230 including a memory cell array. The DRAM 200 may further include a bad page listing part or unit 210 which stores bad page information indicating a page address of a failed memory cell in the memory cell array.

Figure 2:
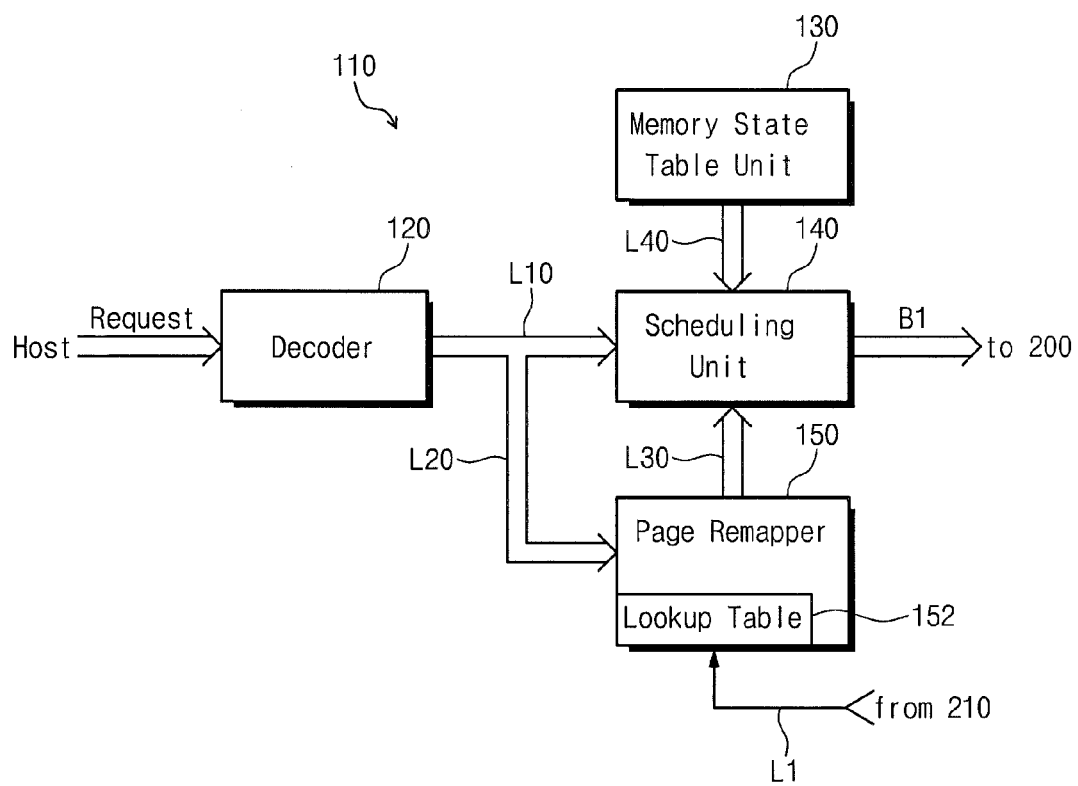
FIG. 2 is a schematic block diagram of a bad page management unit of FIG. 1 in accordance with an example embodiment of the present inventive concepts.

A DRAM controller as the memory controller 100 may include a bad page management, or managing, unit 110 as illustrated in FIG. 2.

The memory controller 100 such as the DRAM controller may be connected to a host, for example, a microprocessor.

The DRAM controller 100 receives bad page information through line L1 from the bad page listing unit 210 of the DRAM 200 in a system initialization operation section.

The DRAM controller 100 applies a command and an address to the DRAM 200 through a bus B1 in a normal operation mode accessing the DRAM 200.

The DRAM controller 100 applies write data to the DRAM 200 or receives read data from the DRAM 200 through a bus B2 in a normal operation mode.

The bad page information is described as being received by the memory controller 100 through the line L1; however, the present inventive concepts are not limited thereto. For example, the bad page information may be received by the memory controller 100 through the bus B2.

In FIG. 1, the bad page listing unit 210 may include an anti-fuse circuit block. The anti-fuse circuit block may include an anti-fuse and a pull-up/pull-down drive circuit.

When using a laser fuse to cut a fuse, a program is performed using a laser to cut a fuse made of a metal line. When using a laser to cut a fuse, in order to protect adjacent fuses, a specific distance between fuses has to be guaranteed. Regardless of the development of a memory manufacturing process technology such as a metal oxide semiconductor process, a laser fuse is limited in that integration is increased and a laser fuse may not be used after a memory chip is packaged.

When using an electrical fuse and an anti-fuse, a program is performed using an electrical signal. Since a fuse is activated or deactivated by an electrical signal, a fuse can be used even after a memory chip is packaged. As a process scale is reduced, a size of a fuse circuit can be reduced together with the reduction of the process scale.

A program using an e-fuse is performed by applying a high current to the e-fuse. An e-fuse can be ruptured by applying a control signal from an external source after packaging, but a driver of a comparatively large size is needed to pass a large quantity of currents through an e-fuse.

Unlike an e-fuse, a program using an anti-fuse is performed by applying a high voltage to both ends of the anti-fuse. An anti-fuse is embodied by a capacitor. If a high voltage is applied to both ends of an anti-fuse, an internal dielectric material of the capacitor is ruptured and, thereby, the anti-fuse functions as a conductor. An anti-fuse can be ruptured by applying a control signal from an external source even after packaging. In an embodiment of the inventive concepts, an anti-fuse or an e-fuse can be used in a fuse block.

FIG. 2 is a schematic block diagram of the bad page managing unit 110 of FIG. 1.

Referring to FIG. 2, the bad page managing unit 110 includes a scheduling unit 140 and a page remapper 150. The bad page managing unit 110 may also include a decoder 120 and a memory state table unit 130.

The scheduling unit 140 generates a command and an address to access the memory such as the DRAM 200 and provides the command and address to the DRAM 200 on bus B2.

The page remapper 150 receives bad page information from the bad page listing unit 210 of the DRAM 200 through the line L1 to remap bad pages of the DRAM 200 in a system initialization operation section.

The page remapper 150 operates in parallel with the scheduling unit 140 in a normal operation of the scheduling unit 140 to perform a latency overhead hidden function of the DRAM 200.

Figure 3:
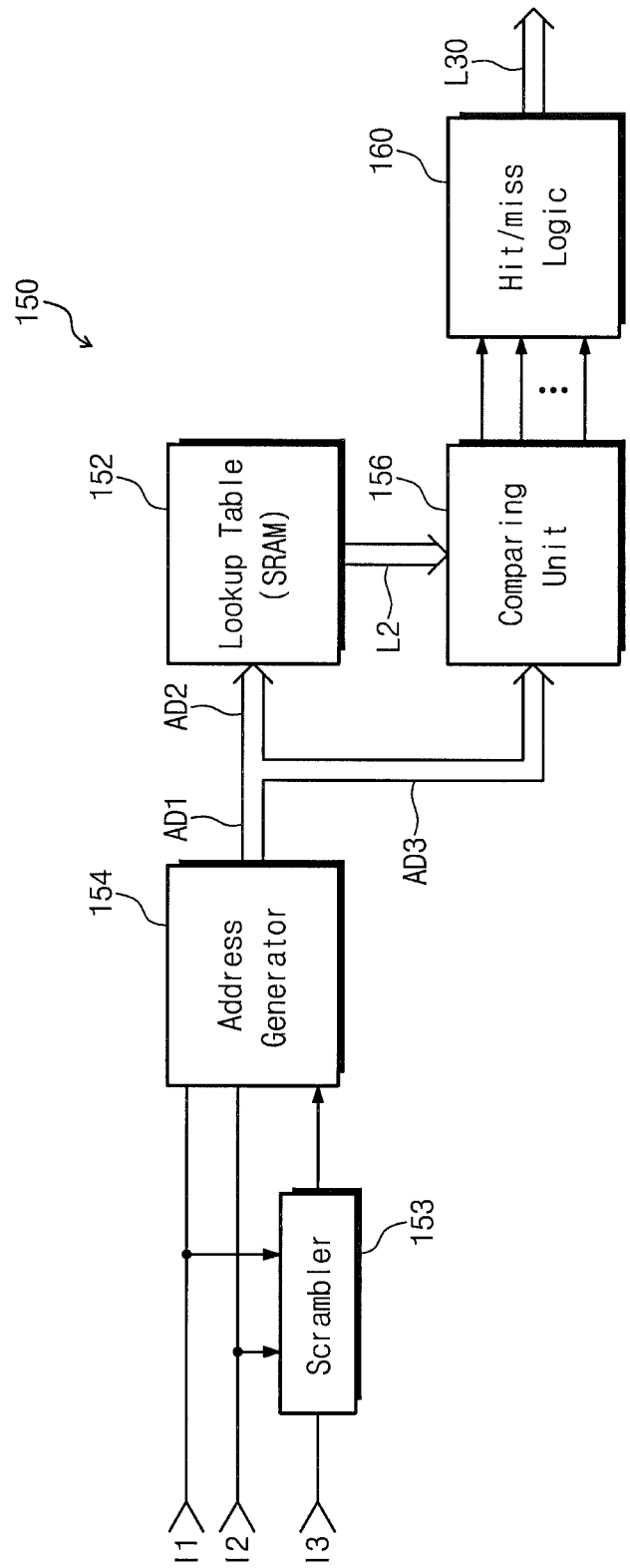
FIG. 3 is a schematic block diagram of a page remapper of FIG. 2 in accordance with an example embodiment of the present inventive concepts.

FIG. 3 is a block diagram of the page remapper 150 of FIG. 2 in accordance with an example embodiment of the present inventive concepts.

Referring to FIG. 3, the page remapper 150 includes a lookup table 152, for example an SRAM, for storing and managing the bad page information, an address generator 154 receiving an input address to generate an internal address for an address remapping, a comparing unit 156 comparing a part of the internal address from the address generator 154 with an address being output from the lookup table 152 through a line L2, and hit/miss logic 160 selectively outputting a remapping address or the input address according to a comparison result of the comparing unit 156.

The address generator 154 receives input addresses from inputs I1, I2 and from a scrambler 153.

The page remapper 150 may further include the scrambler 153. The scrambler 153 may be installed to perform a mapping function of scrambling page addresses when a correlation exists between a page location and an error rate. The scrambler 153 receives an input addresses from the inputs I1, I2 and I3.

An internal address generated from the address generator 154 appears on an address line AD1. A part of the internal address appearing on the address line AD1 is applied to the lookup table 152 through an address line AD2. The remainder of the internal address appearing on the address line AD1 is applied to the comparing unit 156 through an address line AD3. The comparing unit 156 receives an address being output from the lookup table 152 through a line L2 and a part of the internal address from the address generator 154 through the address line AD3. The comparing unit 156 compares the part of the internal address from the address generator 154 with the address being output from the lookup table 152.

The remapping address being output from the hit/miss logic 160 is applied to the scheduling unit 140 of FIG. 2 through an address line L30.

Referring back to FIG. 2, if a request from the host is applied to the decoder 120, the decoder 120 decodes an address included in the request.

A decoding address output from the decoder 120 is applied to the scheduling unit 140 through a line L10 and is applied to the page remapper 150 through a line L20.

The scheduling unit 140 receives memory state information being applied from the memory state table unit 130 through a line L40 to schedule the DRAM 200. A command and an address that are needed to access the DRAM 200 are generated by the scheduling unit 140.

When scheduling the memory such as the DRAM 200, the scheduling unit 140 receives a remapping address being provided from the page remapper 150 or the input address from the page remapper 150 through the line L30. When the remapping address is output from the bus B1 of the scheduling unit 140, a spare page is accessed instead of a bad page.

Figure 4:
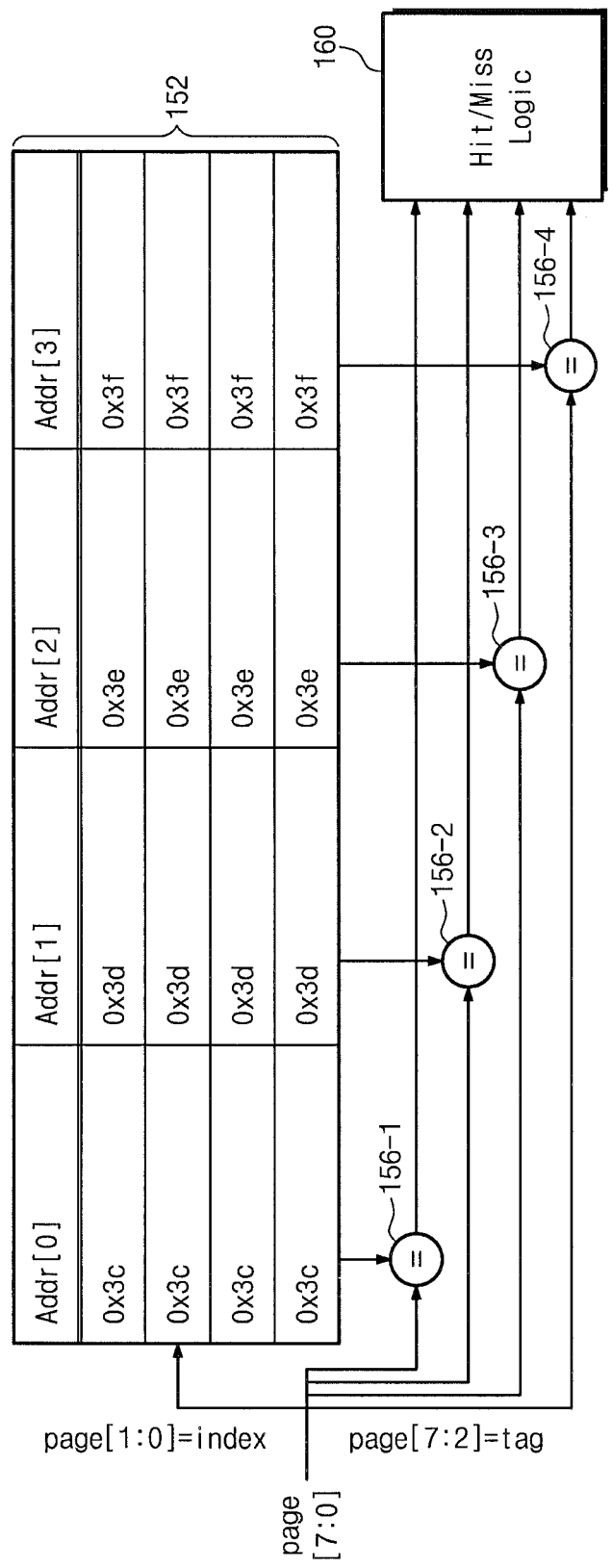
FIG. 4 is a partial block diagram of the page remapper of FIG. 3 including a lookup table.

FIG. 4 is a partial block diagram of the page remapper 150 of FIG. 3 including a lookup table in accordance with an example embodiment of the present inventive concepts.

Referring to FIG. 4, the lookup table 152 is a 4×4 table illustrating the use of 16 pages being used as spare pages.

For example, if the number of word lines activating a row of a memory cell array in a DRAM is 256, the total number of pages is 256. 16 pages of the 256 pages are used as spare pages. When a page address of the spare pages is assigned to a high-order address among total addresses, the page address of the spare pages may be given as 0xf0-0xff. A page address of normal pages may be assigned to the remaining addresses to be given as 0x00-0xef. 16 pages of 256 pages are assigned as spare pages for defect relief, that is, to replace defective pages, and 240 pages of 256 pages are assigned as normal pages. During testing, if bad pages are detected among the 240 normal pages, the maximum number of bad pages that may be replaced is 16. Should 17 or more pages be proven to be bad pages, the DRAM 200 is treated as defective and, thereby, the DRAM 200 is discarded.

The lookup table 152 of FIG. 4 is effective only when the number of bad pages that occurs among 240 normal pages is 16 or less.

The lookup table 152 may include a static random access memory SRAM, a magnetic random access memory MRAM or a register file. A memory size of the lookup table 152 may be determined according to the number of spare pages being set.

A memory row size of the lookup table 152 is determined according to a set associative value. Since a 2 bit address is used in FIG. 4, a set associative value is 4.

Addresses (for example, 0x3c expressed by hexadecimal) illustrated in the lookup table 152 of FIG. 4 are addresses of randomly expressed pages and when bad pages do not occur, the hit/miss logic 160 bypasses an input address.

Comparators 156-1~156-4 illustrated in FIG. 4 are included in the comparing unit 156 of FIG. 3 and compare the address output from the look up table with a part of the internal address from the address generator 154. A reference mark 160 is hit/miss logic and is identical to the hit/miss logic of FIG. 3.

In FIG. 4, since 16 pages of 256 pages are assigned as spare pages, 8 bits are assigned to an input page address and low-order 2 bits [1:0] of the 8 bits of the input page address are used as an index address of the lookup table 152. The remaining 6 bits [7:2] of the 8 bits of the input page address are used as a tag address.

Although 16 pages are assigned as spare pages and a lookup table 152 is illustrated as a 4×4 table in FIG. 4, the inventive concepts are not limited to this example embodiment. The number of spare pages being assigned may be added or subtracted and the lookup table may be formed differently.

The total number of pages can be greatly increased according to an increase of a memory capacity to become 1028576 or more.

Figure 5:
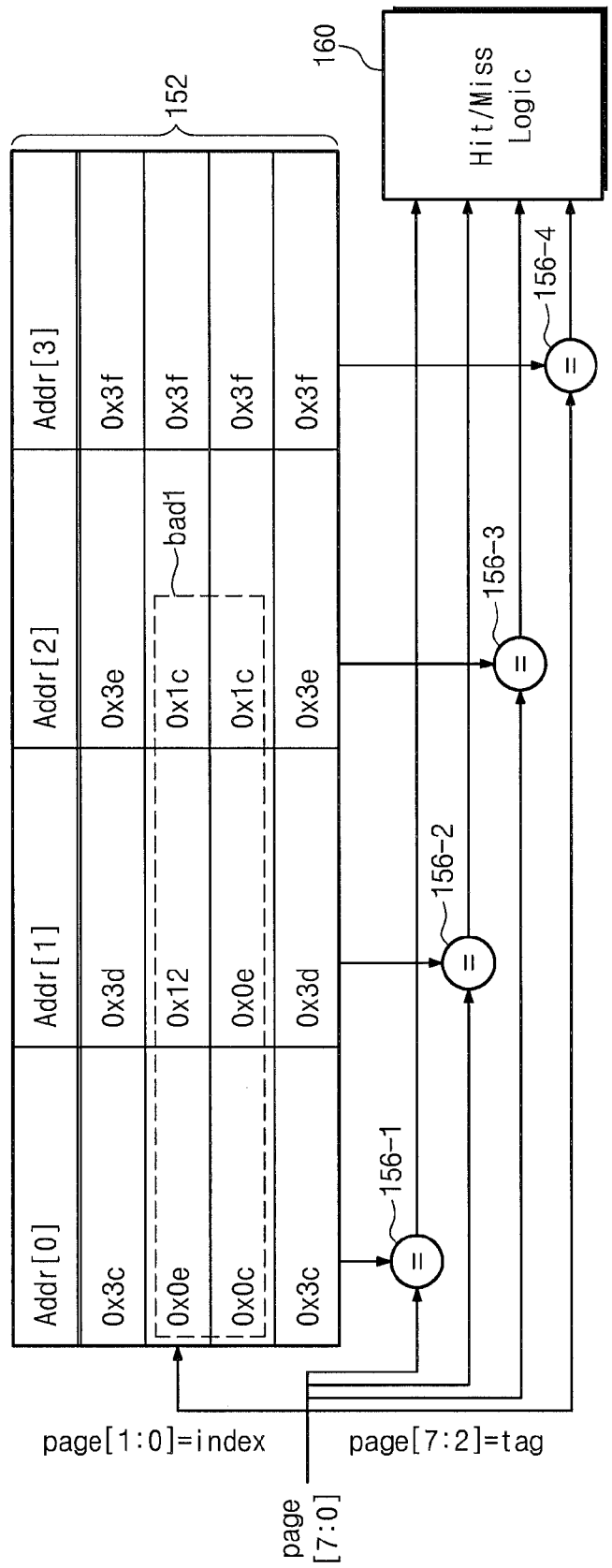
FIG. 5 is a partial block diagram of the page remapper of FIG. 4 illustrating an embodiment in which bad pages are stored.

FIG. 5 is a partial block diagram of the page remapper 150 of FIG. 4 illustrating an embodiment in which bad pages are stored.

Unlike the example embodiment of FIG. 4, if 0x32, 0x39, 0x3a, 0x49, 0x71, 0x72 pages of 240 pages are bad pages, 6 bad pages may be stored in a storage region bad1 of the lookup table 152 of FIG. 5. Addresses (for example, 0x0e expressed by hexadecimal) illustrated in the storage region bad1 are addresses of randomly expressed pages.

In the example embodiment of bad page 0x39, an address of the bad page becomes 00111001 as a binary number. If the bad page 00111001 is recorded in a second row and a first column of the lookup table 152 of FIG. 5, an address of a spare page which will replace the bad page is read as Ser. No. 11/110,001. A high-order address 0011 of the bad page is changed to a high-order address 1111 of a spare page. Since the bad page is located at the second row and the first column, a low-order address 1001 of the bad page is changed to 00 (first column address) 01 (second row address). Thus, if in the case that an address 001111001 of the bad page is stored in the second row and the first column, if an input address corresponding to the address 001111001 of the bad page is entered, an address of the spare page is read as Ser. No. 11/110,001. The hit/miss logic 160 generates the address 11110001 of the spare page as an output address.

If a row of the lookup table 152 of FIG. 5 is accessed as the least significant bit (LSB), the comparing unit 156 compares whether a bad page is hit in all columns in the accessed row. Since in case of the bad page 001111001 of FIG. 5, it is hit in the second row and the first column, the address 11110001 of the spare page becomes an output address.

In example embodiment of the bad page 0x49, an address of the bad page becomes 01001001 as a binary number. If the bad page 01001001 is recorded in a second row and a second column of the lookup table of FIG. 5, an address of a spare page that will replace the bad page is read as 11110101. A high-order address 0100 of the bad page is changed to a high-order address 1111 of the spare page and an address of the second row and the second column is 0101. Thus, in the embodiment in which the address 01001001 of the bad page is stored in the second row and the second column, an input address corresponding to the bad page is entered, an address of the spare page is read as 11110101.

In FIG. 5, since the number of bad pages stored in one row is less than a set associative value, an overflow issue does not exist. Since the number of bad pages stored in one row is 3 and the set associative value is 4, an overflow issue does not exist. However, in the example embodiment of FIG. 6, an overflow issue may exist.

Figure 6:
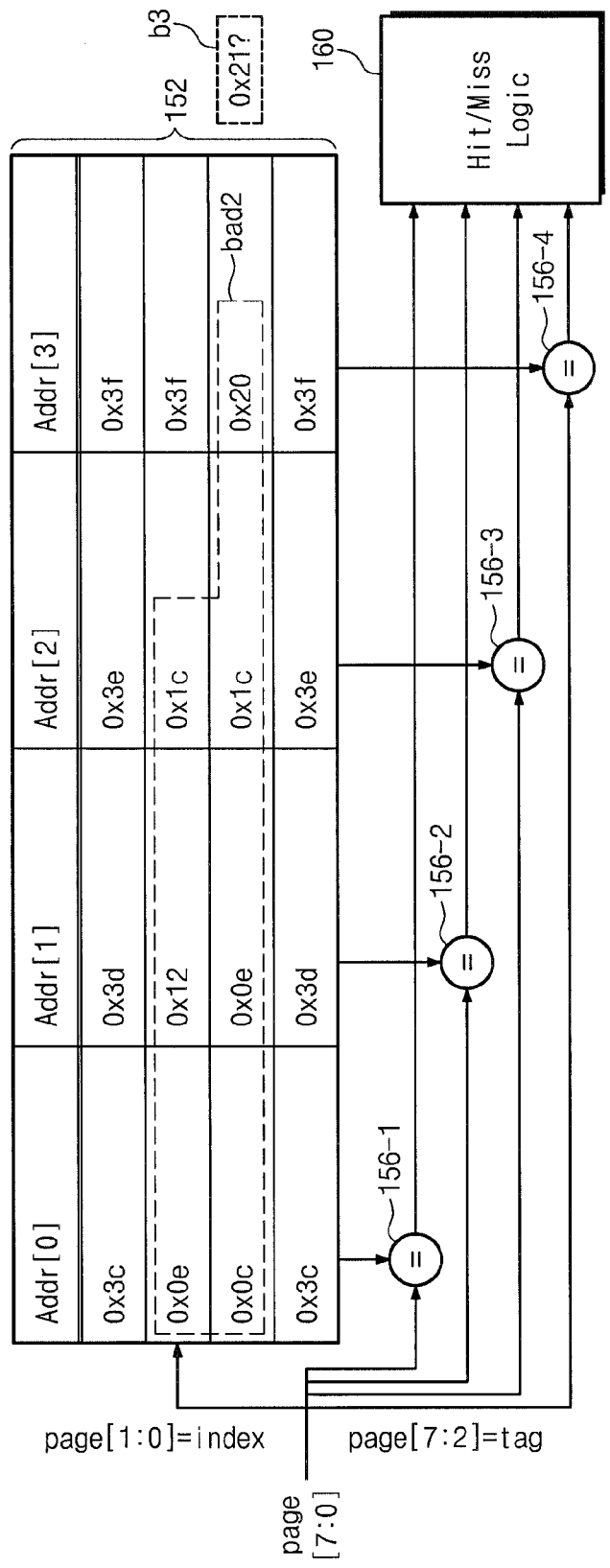
FIG. 6 is a partial block diagram of the page remapper of FIG. 5 illustrating an overflow issue when additional bad pages are generated.

FIG. 6 is a partial block diagram of the page remapper of FIG. 5 illustrating an overflow issue when additional bad pages are generated. That is, in FIG. 6 an overflow issue occurs.

Unlike the example embodiment of FIG. 5, if 0x32, 0x39, 0x3a, 0x49, 0x71, 0x72, 0x82, 0x86 pages among 240 pages are bad pages, 7 bad pages may be stored in a storage region bad2 of the lookup table 152 of FIG. 6. As there are 8 bad pages and only 7 bad pages may be stored in storage region bad2, 0x86 page may not be stored in the storage region bad2 due to a row overflow issue. b3 expresses the overflow issue. Since 86 can be expressed by 21×4 (set associative value)+2 in hexadecimal 0x86, it is expressed by 0x21? in b3 of FIG. 6. Herein, the question mark '?' indicates that it is unknown where the bad page should be stored. In the example embodiment in which the number of bad pages that have occurred is larger than the set associative value, an overflow issue occurs. That is, when all of bad pages cannot be stored in a given row, a row overflow issue occurs.

Figure 7:
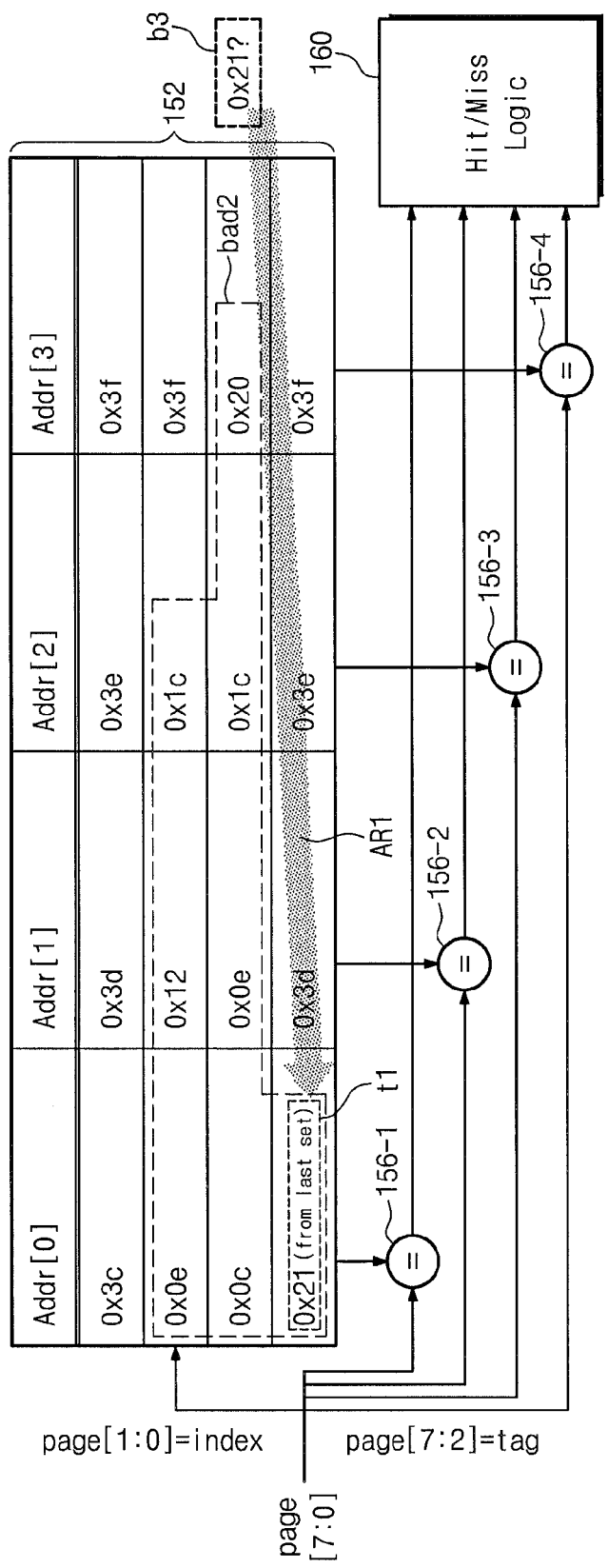
FIG. 7 is a partial block diagram of the page remapper of FIG. 6 illustrating a method of solving an overflow issue of FIG. 6.

FIG. 7 is a partial block diagram of the page remapper of FIG. 6 illustrating a method of solving an overflow issue of FIG. 6. That is, FIG. 7 illustrates a solution to the overflow issue of FIG. 6.

Referring to FIG. 7, the overflowed bad page 0x21? of b3 of FIG. 6 is stored in a region t1 of a next row along an arrow AR1. In the embodiment in which an overflowed bad page is placed in a next set, information is needed which indicates that the overflowed bad page is stored in a current row due to an overflow. It is necessary to identify that 0x21 comes from the last set when searching the lookup table.

Figure 8:
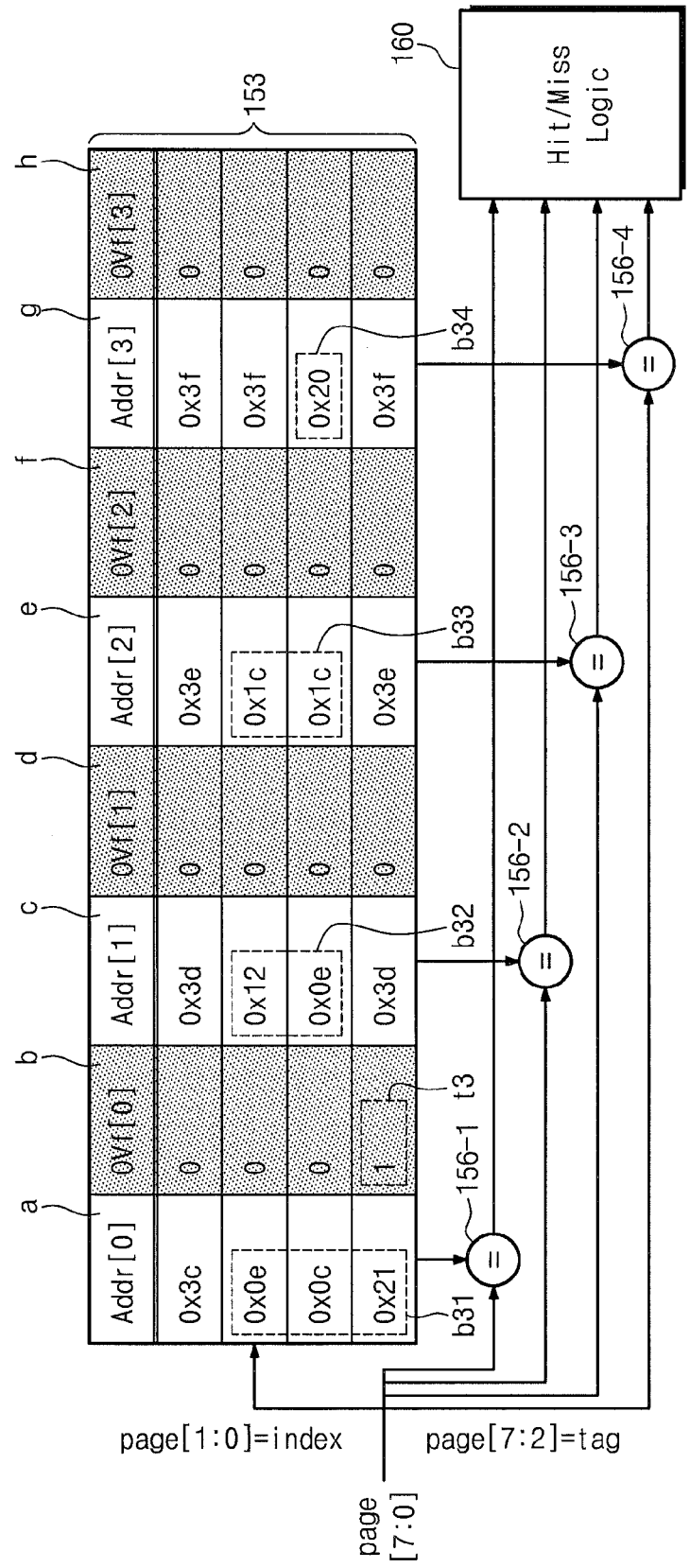
FIG. 8 is a partial block diagram of the page remapper illustrating a method of solving the overflow issue of FIG. 6 in accordance with an example embodiment of the present inventive concepts.

FIG. 8 is a partial block diagram of the page remapper illustrating a method of solving the overflow issue of FIG. 6 in accordance with an example embodiment of the present inventive concepts.

Referring to FIG. 8, a lookup table 153 having a set overflow bit Ovf is shown at every bad page. That is, a set overflow bit Ovf is provided for each page in the lookup table 153.

When data "1" is marked in a region t3 of a set overflow bit Ovf[0] corresponding to the bad page 0x21, it indicates that the bad page 0x21 comes from a previous set due to an overflow. Thus, if a bit region performs as a set overflow marking to indicate that an overflowed bad page is placed in a next set, a set overflow issue in a lookup table can be easily solved. If data "0" is marked as the set overflow bit, the corresponding page is not from a previous set due to an overflow. While it is described that data "1" indicates that a bad page comes from a previous set due to overflow, the present inventive concepts are not limited thereto. Alternatively, data "0" may be used to indicate that a bad page comes from a previous set due to overflow.

In FIG. 8, regions a, c, e, and g of a column direction indicate page address regions and regions b, d, f, and h of a column direction indicate regions of the set overflow bit Ovf [0-3]. The set overflow bit can be given as 1 bit. Thus, when the set overflow bit in regions b, d, for h is data "1", it indicates that the corresponding page is a bad page from the previous set.

Figure 9:
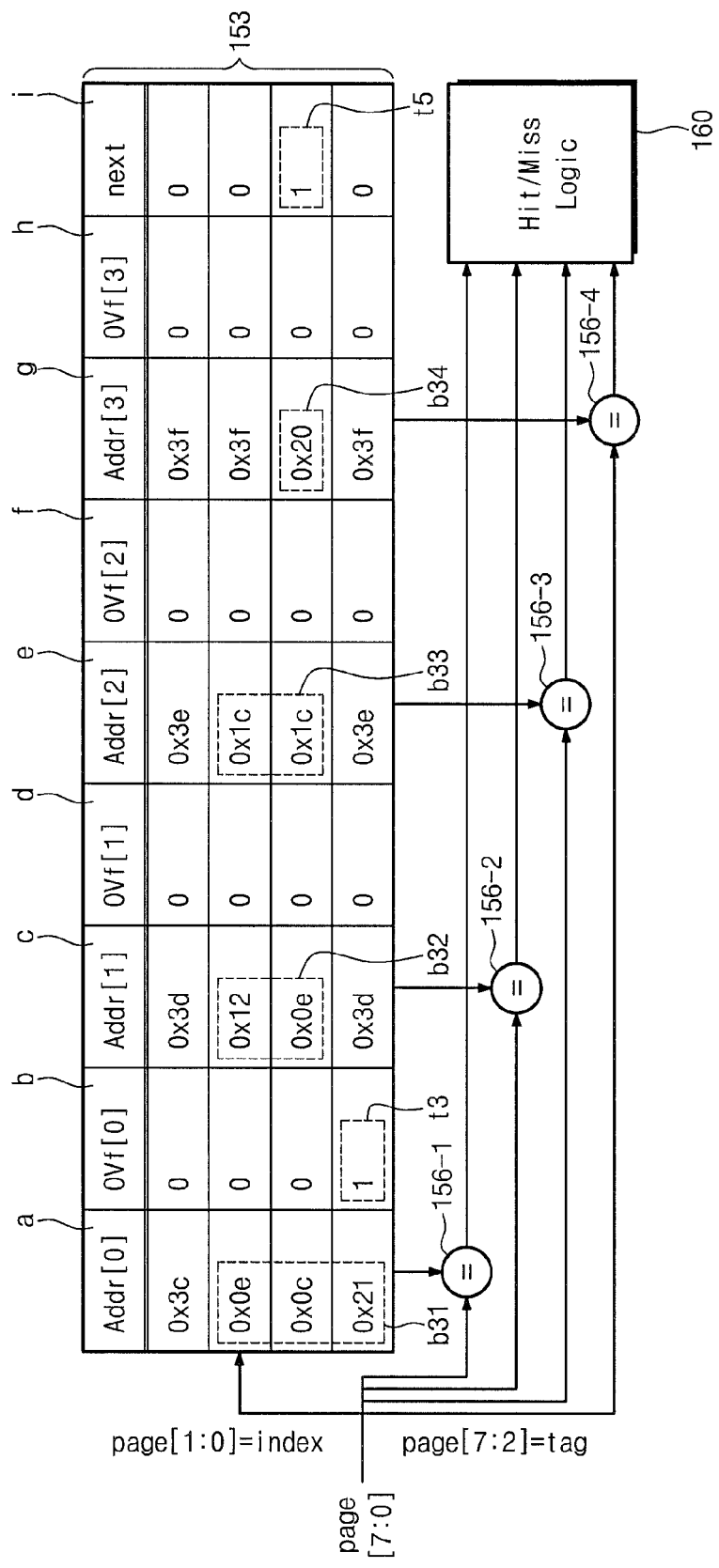
FIG. 9 is another partial block diagram of the page remapper illustrating a method of solving the overflow issue of FIG. 6.

FIG. 9 is another partial block diagram of the page remapper 150 illustrating a method of solving the overflow issue of FIG. 6.

Referring to FIG. 9, in addition to the assignment of the set overflow bit t3 of FIG. 8, a next row confirm flag bit is further assigned to the lookup table 152, for example t5, in region i.

When the number of bad pages that occurs exceeds a set associative value, the lookup table 153 of FIG. 9 further includes a next row confirm flag bit for indicating that fact by a last row unit of the lookup table.

A data "1" indicated by the block t3 indicates that, since there are bad pages overflowed in a current row, a next row has to be checked.

The region (i) of a column direction in FIG. 9 indicates regions of the next row confirm flag bit. The confirm flag bit may be given as "1" bit.

If "1" is marked in the next row confirm flag bit, it indicates that a bad page pushed to the next row exists. If "0" is marked in the next row confirm flag bit, it indicates that a bad page is not pushed to next row. Alternatively, a "0" bit may indicate that a bad page is pushed to the next row and a "1" may indicate that a bad page is not pushed to the next row. The next row confirm flag bit is stored under the control of the DRAM controller when a lookup table is generated.

Figure 10:
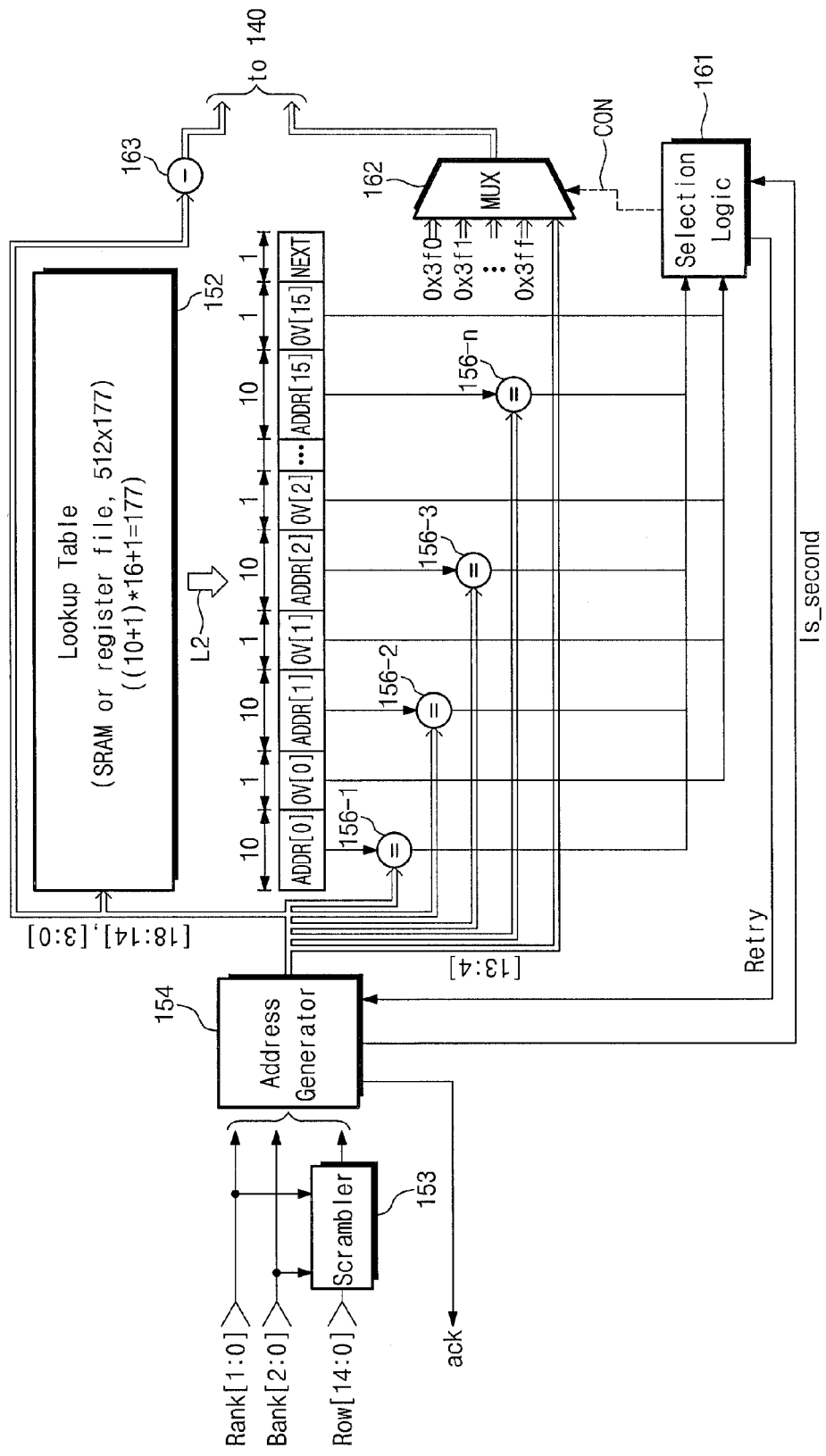
FIG. 10 is a block diagram illustrating an example embodiment of the page remapper of FIG. 3 in accordance with an example embodiment of the present inventive concepts.

FIG. 10 is a block diagram illustrating an example embodiment of the page remapper of FIG. 3 in accordance with an example embodiment of the present inventive concepts.

Referring to FIG. 10, the number of bits of one row in the lookup table 152 is 177, as an example. In this example embodiment, in determining the number of bits of one row in the lookup table 152, 16 bad pages are stored in one row and one bad page includes a bad page address of 10 bits and a set overflow bit of 1 bit. Thus, in calculating the number of bits of one row in the lookup table 152, (bad page of 10 bits+set overflow bit of 1 bit)×16 bad pages+next row confirm flag bit of 1 bit), the sum becomes 177 bits.

The address generator 154 generates an address of 19 bits as an internal address. A part [18:14] of high-order address and a part [3:0] of low-order address are used as inputs to the lookup table 152 and as inputs to a bypass unit 163, respectively, and the remaining part [13:4] of the internal address having 19 bits is used as an input of the comparing unit 156.

The hit/miss logic 160 of FIG. 3 includes selection logic 161 and a multiplexer 162.

An output of an overflow bit of the lookup table 152 and a comparison output of the comparing unit 156 (including comparators 156-1-156-n) are applied to the selection logic 161. When a hit of a bad page occurs, the selection logic 161 applies a control signal CON to the multiplexer 162. When a miss of a bad page occurs, an input address bypasses to the output by controlling the bypass unit 163. When a miss of a bad page occurs in a current row, the selection logic 161 applies a retry signal to the address generator 154 and receives a signal (i s_second) that indicates a second try.

When a comparison result of the comparing unit 156 indicates a hit of a bad page, the remapping address is output from the multiplexer 162. When a comparison result of the comparing unit 156 indicates a miss of a bad page, the input address bypasses to the output through the bypass unit 163. That is, the input address bypasses from address generator 154 through bypass 163 to scheduling unit 140.

When the scrambler 153 is installed in the page remapper 150 of FIG. 10, the scrambler 153 scrambles an input address received at inputs I1, I2 and I3. When a correlation exists between a page location and an error rate, the scrambler 153 performs a 1:1 mapping function that scrambles page addresses.

Figure 11:
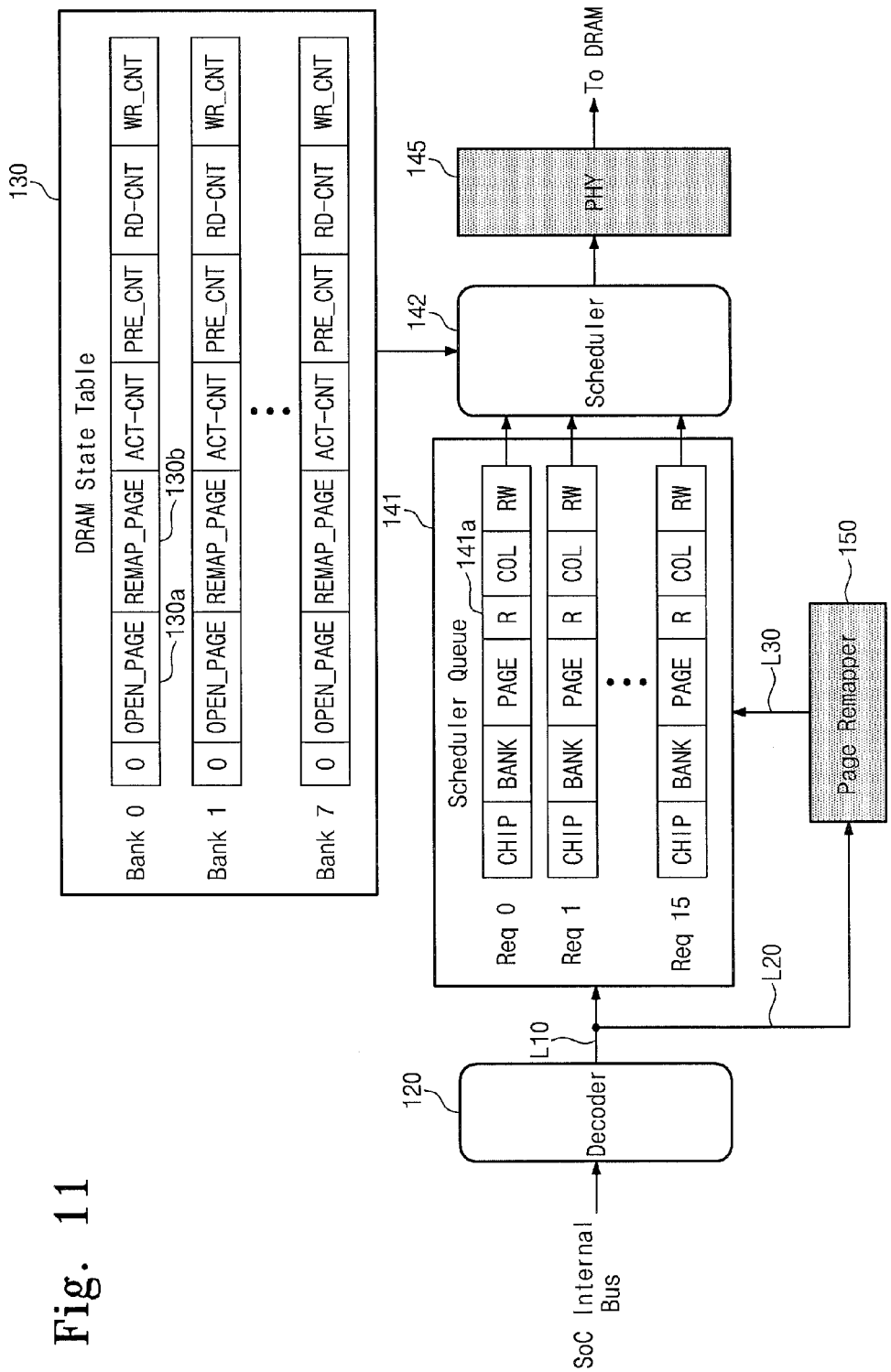
FIG. 11 is a block diagram illustrating an example embodiment of the bad page managing unit of FIG. 2 in accordance with an example embodiment of the present inventive concepts.

FIG. 11 is a block diagram illustrating an example embodiment of the bad page managing unit 210 of FIG. 2 in accordance with an example embodiment of the present inventive concepts.

Referring to FIG. 11, the scheduling unit 140 of FIG. 2 includes a scheduler queue 141, a scheduler 142 and an output PHY 145.

An output address of the page remapper 150 is provided to the scheduler queue 141.

The scheduler 142 refers to the memory state table 130 when a scheduling operation is performed. When a memory cell array includes a plurality of banks, a page number prior to a remapping may be stored in storage region 130a of a bank 0 and a page number after a remapping may be stored in storage region 130b of a bank 0.

A latch region 141a among latch regions of the scheduler queue 141 indicates a remap bit. When the remap bit is "0", a page address prior to a remapping is stored in a corresponding page field and, when the remap bit is "1", a page address after a remapping is stored in a corresponding page field. Alternatively, in another embodiment, when the remap bit is "1", a page address prior to a remapping is stored in a corresponding page field and, when the remap bit is "0", a page address after a remapping is stored in a corresponding page field.

When a request is received from a host, the scheduler 142 schedules data of the scheduler queue 141 with reference to the memory state table 130. As a scheduling result, the scheduler 142 generates a command and an address to access the DRAM 200 and transmits the generated command and address to the DRAM 200 through the output PHY 145.

The output PHY 145 is a device that processes a physical issue. For example, a signal integration, calibration, termination, etc. are performed through the output PHY 145.

In the example embodiment of FIG. 11, the page remapper 150 operates in parallel with the scheduler 142 in a normal operation section of the scheduler 142 to perform a latency overhead hidden function of the DRAM 200.

The page remapper 150 receives the bad page information from the bad page listing unit 210 in a system initialization operation section of a memory system to remap bad pages of the DRAM 200.

As described in FIG. 11, the DRAM controller may hide a remapping operation in a DRAM command scheduling pipe line.

A lookup table of the page remapper 150 is set up during an initialization operation and is not updated during a normal operation.

A latency overhead hidden function is further described with reference to FIG. 12.

Figure 12:
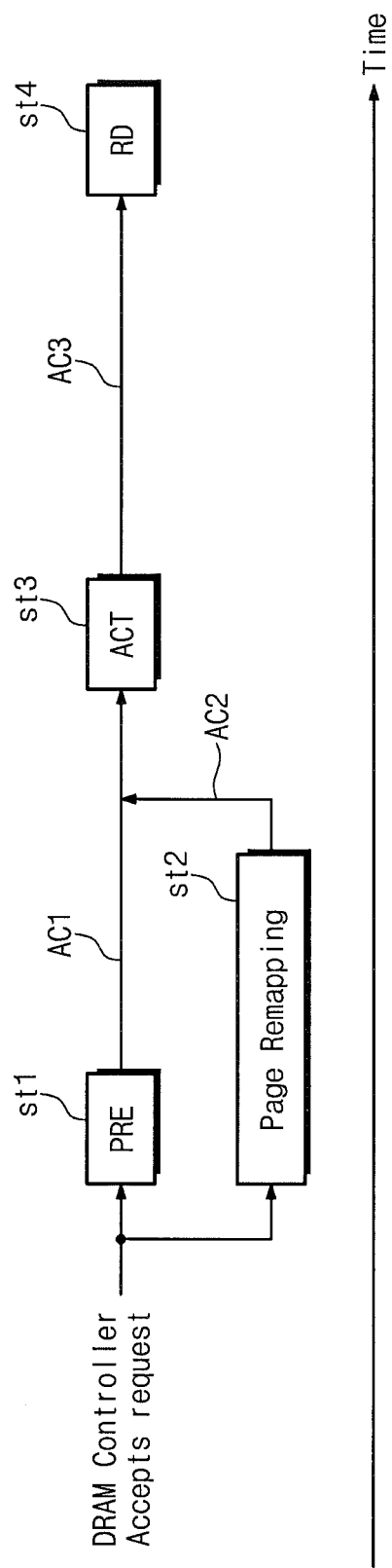
FIG. 12 is an operation timing diagram of a memory system illustrating a latency overhead hidden function in accordance with an example embodiment of the present inventive concepts.

FIG. 12 is an operation timing diagram of a memory system illustrating a latency overhead hidden function in accordance with an example embodiment of the present inventive concepts.

Since a page remapping operation of the page remapper 150 does not require generation of commands of a DRAM such as precharge, read and write, it can operate in parallel with the scheduler 142.

Since a DRAM is very sensitive to a latency issue as compared with a nonvolatile memory, if operation latency occurs during a page remapping, performance of the DRAM is degraded.

In example embodiments of the inventive concepts, as illustrated in FIG. 12, since a page remapping is performed in the memory controller in parallel with a precharge operation of the scheduler 142, latency overhead is hidden.

In FIG. 12, the rightmost time axis indicates a final operation. If a page remapping operation st2 and a precharge operation st1 are performed in parallel with each other, for example, at the same time, an output Ac2 is generated before an active operation st3. Since a page remapping operation st2 is completed in a section Ac1 between the precharge operation st1 and the active operation st3 within a normal operation section, latency overhead does not exist or is minimized A section Ac3 between the active operation st3 and a read operation st4 is a section in which a selected page of the DRAM is activated and, thereby, a sensing amplifier sensing data stored in memory cells operates.

Figure 13:
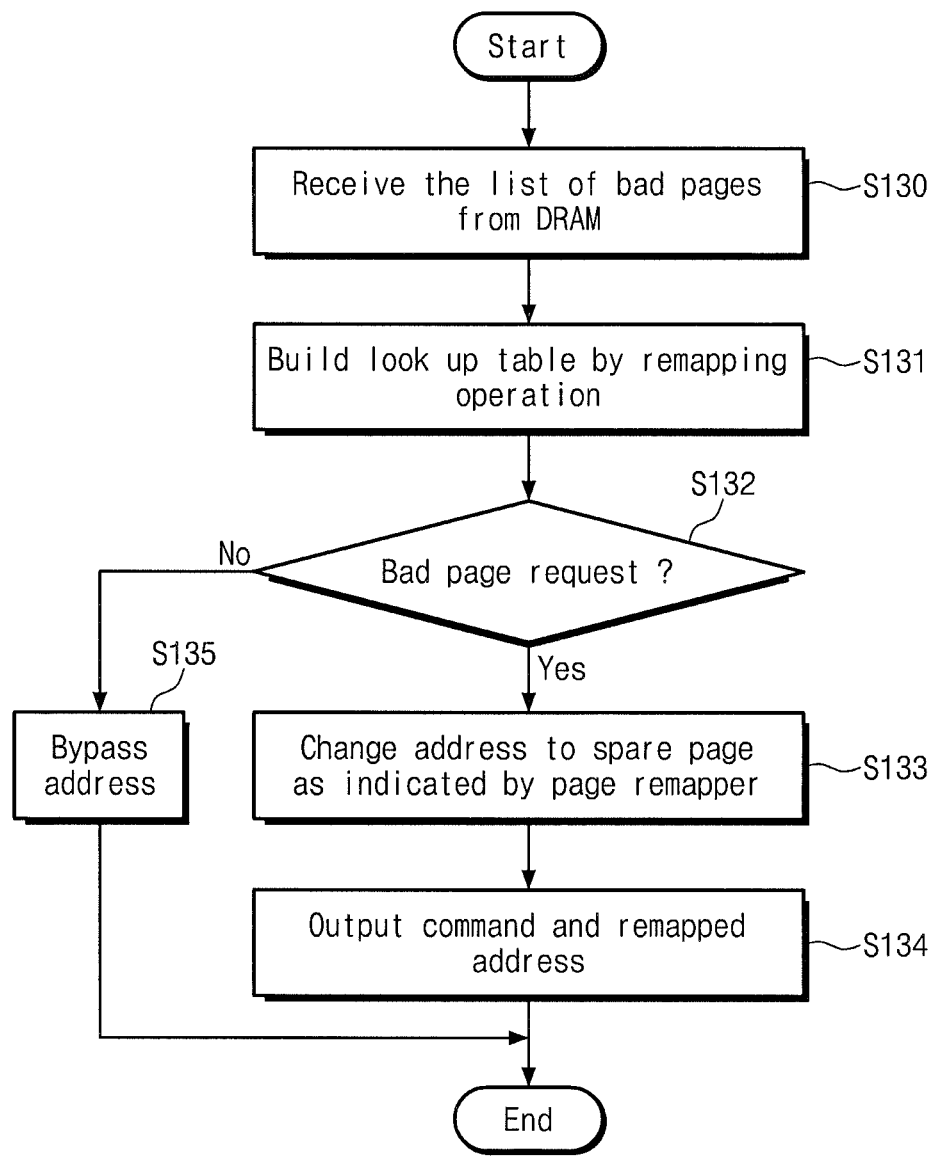
FIG. 13 is a flowchart of an operation of a memory controller of FIG. 1 in accordance with an example embodiment of the present inventive concepts.

FIG. 13 is a flowchart illustrating an operation of the memory controller 100 of FIG. 1.

Referring to FIG. 13, if a power supply is applied to the memory system 10 to power up the memory system 10, an initialization operation of the memory system 10 is executed. When the initialization operation is executed, the memory controller 100 receives bad page information in a step S130. The bad page information is received from the bad page listing unit 210 in the DRAM 200 of FIG. 1.

The memory controller 100 controls the page remapper 150 to generate a lookup table, in a step S131 using a remapping operation. Accordingly, the lookup table 152 may be in a format such as illustrated in FIG. 8 or FIG. 9. That is, the lookup table may include an overflow bit and/or a next row confirm flag.

If a request is applied in a step S132, it is determined whether bad pages in the lookup table are hit or missed, for example by hit/miss logic 160. If bad page is hit, in a step S133, an input page address is changed to a spare page address as remapped by the page remapper 150.

Following step S133, in a step S134, the memory controller controls the scheduler 142 to provide a command and a remapping address output.

In a step S135, if it is determined that a bad page is missed in step S132, an input page address bypasses to the output, for example through bypass 163.

Thus, the memory system 10 prevents an issue of an increase in a memory size of a DRAM for realization of a page redundancy scheme by providing a page remapper and performing a remapping operation using a latency hidden scheme in the DRAM controller 100. That is, since the DRAM 200 includes only the bad page listing unit 210, an overhead of a chip size is reduced.

Since a latency overhead hidden function is accomplished by a parallel controlling operation of the DRAM controller, a bad page can be managed without degradation of performance.

FIG. 14 is a table illustrating an overhead when generating a lookup table of FIG. 3.

Referring to FIG. 14, overheads of a lookup table are shown with respect to five cases of the number of total pages. For example, when the number of total pages is 1048576, the number of sets is 1024, the number of bits of a width per set is 177 and a size of the lookup table is 181248 kbits. In the table of FIG. 14, 1024 indicates the number of rows included in the lookup table. That is, the number of sets is the number of rows of the lookup table. FIG. 14 is an embodiment in which the number of spare pages per set is 16. When the number of pages per set is 1024 including the number 16 of spare pages, an overhead size is given as 16/1024, that is, 1.6%.

Figure 15:
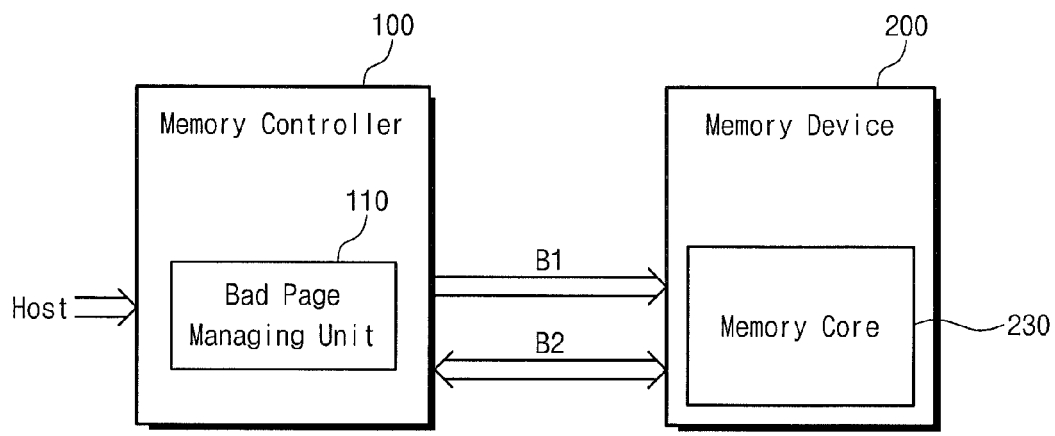
FIG. 15 is a schematic block diagram of a memory system in accordance with another example embodiment of the present inventive concepts.

FIG. 15 is a schematic block diagram of a memory system in accordance with another example embodiment of the present inventive concepts.

Referring to FIG. 15, a memory system includes a memory controller 100 and a memory device 200, for example, as a dynamic random access memory (DRAM).

The DRAM 200 includes a memory core 230 including a memory cell array. The DRAM 200 does not include the bad page listing unit 210 illustrated in connection with FIG. 1.

A DRAM controller 100 as the memory controller may include the bad page managing unit 110 illustrated in connection with FIG. 2.

The DRAM controller 100 may be connected to a host such as a microprocessor. The DRAM controller 100 of FIG. 15 directly accesses the DRAM 200 to obtain bad page information in a system initialization operation section. To achieve this, the DRAM controller 100 may apply a test mode command to the DRAM 200 through a bus B1. The DRAM 200 provides bad page information to the memory controller 100 through a bus B2 after receiving the test mode command from the memory controller 100.

The DRAM controller 100 receives the bad page information through the bus B2 and may perform an operation of remapping bad pages of the DRAM 200.

Thus, in the case of FIG. 15, since the DRAM 200 does not have the bad page listing unit 210 of FIG. 1, the bad page listing unit 210 is not occupying space on the DRAM.

Figure 16:
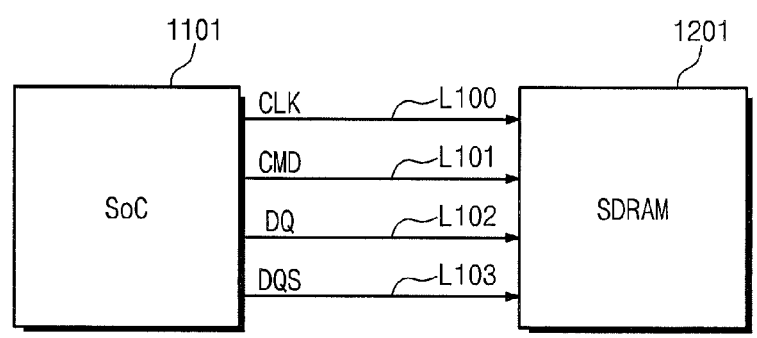
FIG. 16 is a block diagram illustrating an example embodiment of the memory system of the present inventive concepts applied to a SoC.

FIG. 16 is a block diagram illustrating an example embodiment of the memory system of the present inventive concepts applied to a system on chip SoC.

Referring to FIG. 16, a system includes a SoC 1101 and a SDRAM 1201. The SoC 1101 may function as the memory controller 100 illustrated in FIGS. 1 and 15 while still performing a function of the SoC.

The SDRAM 1201 is a synchronous DRAM and performs a read operation and a write operation in synchronization with an external clock. The SDRAM 1201 can function as the memory device illustrated in FIG. 1 or 15.

The SDRAM 1201 receives an external clock CLK provided from the SoC 1101 through a line L100. The SDRAM 1201 receives a command CMD provided from the SoC 1101 through a line L101.

The SDRAM 1201 receives data DQ provided from the SoC 1101 through a line L102. The SoC 1101 receives read data DQ provided from the SDRAM 1201 through the line L102.

A data strobe signal DQS may be provided on a line L103 to match a data input/output timing between the SDRAM 1201 and the SoC 1101.

In the example embodiment of FIG. 16, the SDRAM 1201 may function as a buffer memory or main memory of the SoC 1101. The SDRAM 1201 may include the bad page listing unit 210 of FIG. 1 and may provide bad page information to the SoC 1101 when a power-up operation is performed.

Latency overhead of the SoC 1101 is hidden or minimized by performing a page remapping operation together with, that is, in parallel with, a scheduling operation. Thus, performance of the SoC system 1101 may be stabilized or improved.

Figure 17:
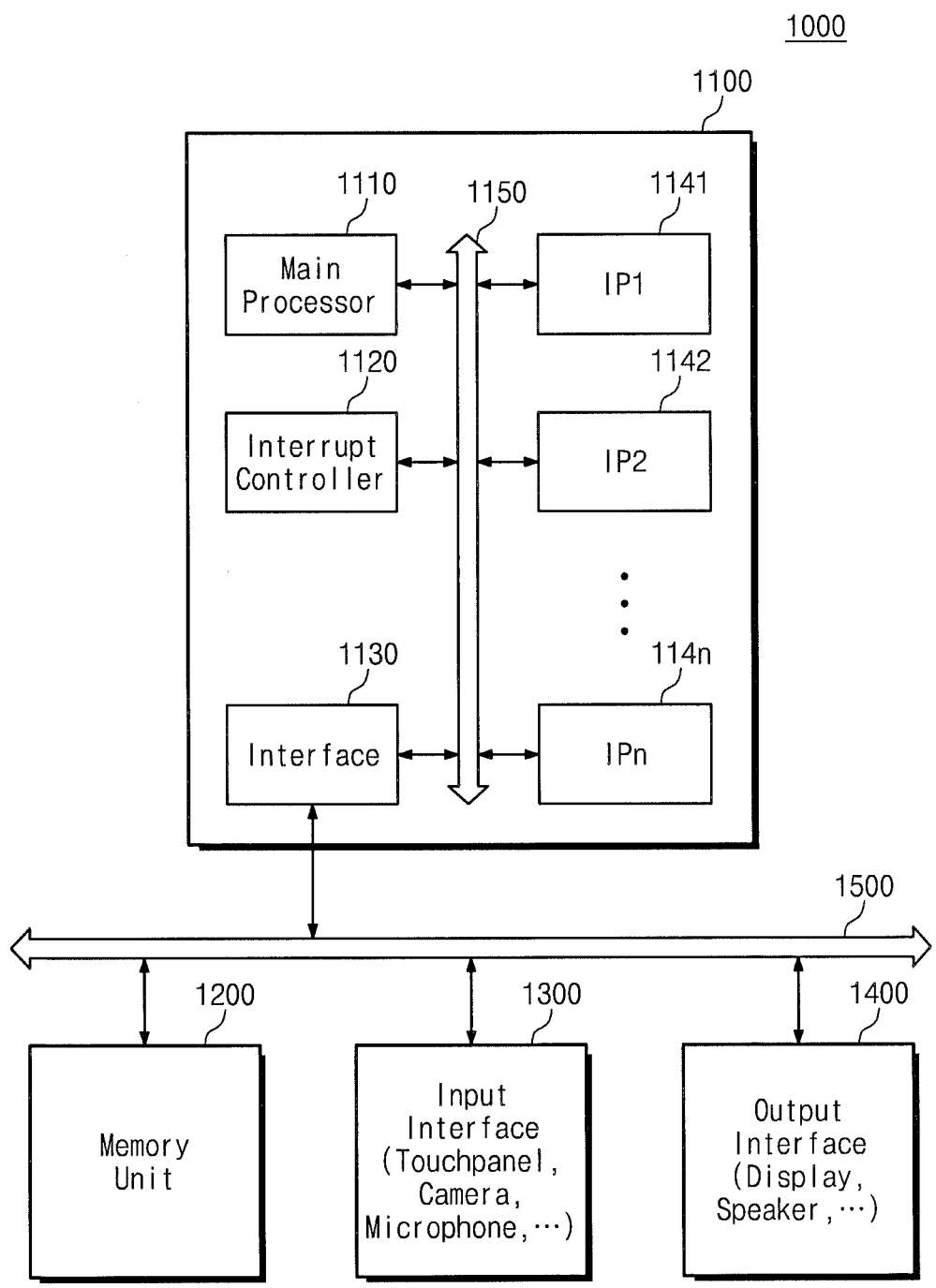
FIG. 17 is a block diagram illustrating an example embodiment of the memory system of the present inventive concepts applied to a multimedia device.

FIG. 17 is a block diagram illustrating an example embodiment of the memory system of the present inventive concepts applied to a multimedia device 1000.

Referring to FIG. 17, a multimedia device 1000 includes an application processor 1100, a memory unit 1200, an input interface 1300, an output interface 1400 and a bus 1500.

The application processor 1100 is configured to control an overall operation of the multimedia device 1000. The application processor 1100 can be formed in a system-on-chip (SoC).

The application processor 1100 includes a main processor 1110, an interrupt controller 1120, an interface 1130, a plurality of intellectual property blocks 114l~114n and an internal bus 1150.

The main processor 1110 may be a core of the application processor 1100. The interrupt controller 1120 may manage interrupts that occur by constituent elements of the application processor 1100 and may inform the main processor 1110.

The interface 1130 may provide an interface for communications between the application processor 1100 and external constituent elements. The interface 1130 may provide an interface for communications so that the application processor 1100 controls external constituent elements. The interface 1130 may include an interface controlling the memory unit 1200 and an interface controlling the input interface 1300 and the output interface 1400.

The interface 1130 may include a joint test action group (JTAG) interface, a test interface controller (TIC) interface, a memory interface, an integrated drive electronics (IDE) interface, a universal serial bus (USB) interface, a serial peripheral interface (SPI), an audio interface, a video interface, and/or the like.

The intellectual property blocks 114l~114n may be configured to perform specific functions respectively. For example, the intellectual property blocks 114l~114n may include an internal memory, a graphic processing unit (GPU), a modem, a sound controller, a security module, and/or the like.

The internal bus 1150 may be configured to provide a channel among internal constituent elements of the application processor 1100. For example, the internal bus 1150 may include an advanced microcontroller bus architecture (AMBA) bus. The internal bus 1150 may include an AMBA high speed bus (AHB) or an AMBA peripheral bus (APB).

The main processor 1100 and the intellectual property blocks 114l~114n may include an internal memory. Image data may be interleaved, in the internal memories, to be stored.

The image data may be interleaved, in the memory unit 1200 that functions as an internal memory and an external memory, to be stored.

The memory unit 1200 is configured to communicate with other constituent elements of the multimedia device 1000 through the bus 1500 of the memory unit 1200.

The input interface 1300 may include various devices receiving a signal from an external device. The input interface 1300 may include a key board, a key pad, a button, a touch panel, a touch screen, a touch pad, a touch ball, a camera including an image sensor, a mike, a gyroscope sensor, a vibration sensor, a data port for a wired input, an antenna for a wireless input, or the like.

The output interface 1400 may include various devices outputting a signal to an external device. The output interface 1400 may include a liquid crystal display (LCD), an organic light emitting diode (OLED) display device, an active crystal display (AMOLED) display device, a LED, a speaker, a motor, a data port for a wired output, an antenna for a wireless output, or the like.

The multimedia device 1000 may automatically edit an image being obtained through an image sensor of the input interface 1300 to output an edition result through a display unit of the output interface 1400. The multimedia device 1000 can provide a video conference service which is specialized for a video conference and has an improved service quality (QoS).

The multimedia device 1000 may include a mobile multimedia device, for example, a smart phone, a smart pad, a digital camera, a digital camcorder, a notebook computer, or the like, and a fixed multimedia, for example, a smart television, a desktop computer, or the like.

In FIG. 17, the memory unit 1200 may function as the memory device 200 illustrated in connection with FIG. 1 and the main processor 1110 may function as the memory controller 100 illustrated in connection with FIG. 1. Thus, a latency overhead of the main processor 1110 may be hidden or minimized by performing a page remapping operation together with, that is in parallel with, a scheduling operation. The memory unit 1200, like the DRAM 200 illustrated in connection with FIG. 1, reduces or minimizes the need for a redundancy block in a circuit.

Figure 18:
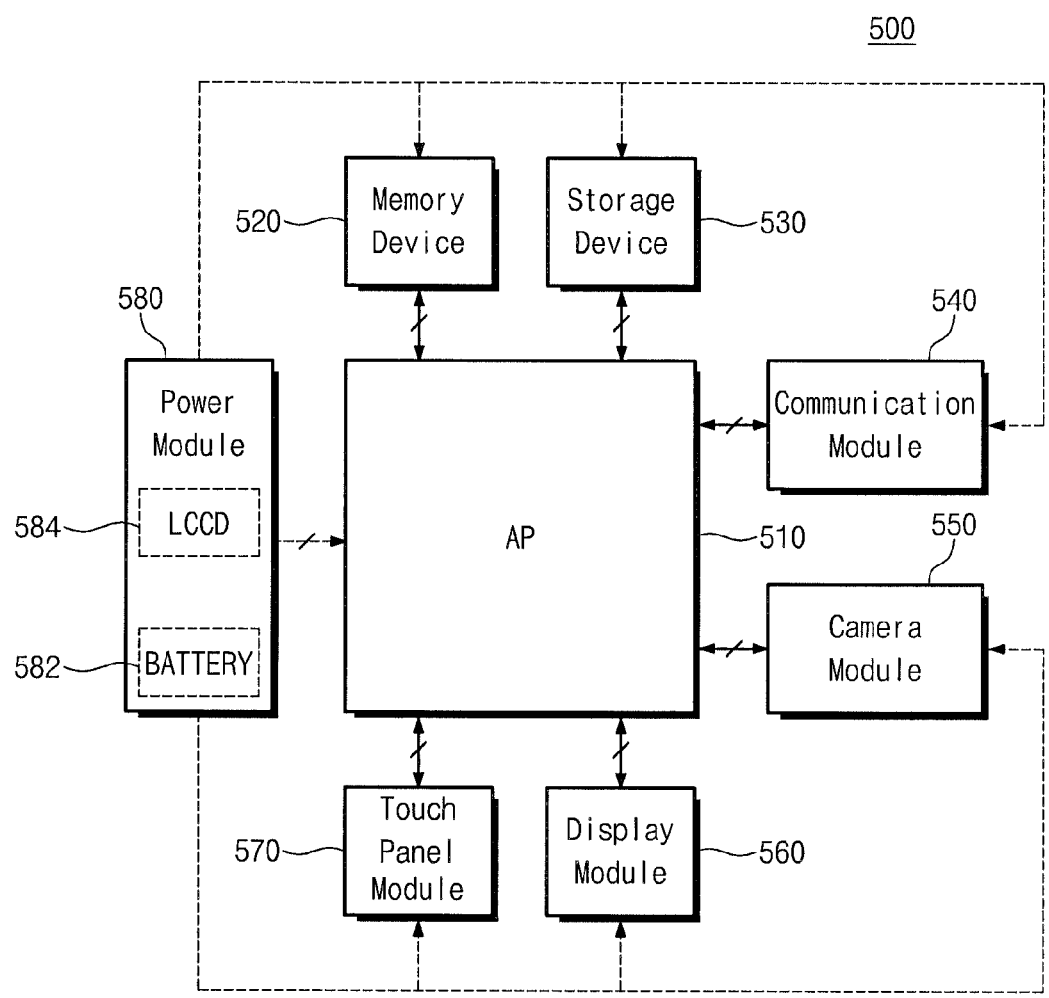
FIG. 18 is a block diagram illustrating an example embodiment of the memory system of the present inventive concepts applied to a mobile device.

FIG. 18 is a block diagram illustrating an example embodiment of the memory system of the present inventive concepts applied to a mobile device 500.

Referring to FIG. 18, the mobile device 500 that may function as, for example, a smart phone may include an AP 510, a memory device 520, a storage device 530, a communication module 540, a camera module 550, a display module 560, a touch panel module 570, and a power module 580.

The memory device 520 may include the bad page listing unit 210 and the memory core 230 of FIG. 1. Alternatively, the memory device 520 may only include the memory core 230 as illustrated in connection with FIG. 15.

Latency overhead of the AP 510 may be hidden or minimized by performing a page remapping operation together with, that is, in parallel with, a scheduling operation. Accordingly, system performance of the mobile device 500 may be stabilized or improved.

The communication module 540 connected to the AP 510 may function as a modem performing a function of a transmission/reception of data or a modulation/demodulation of data.

The storage device 530 may include, for example, a NOR type flash memory or a NAND type flash memory, to store large amounts of information.

The display module 560 may include, for example, a liquid crystal having a back light, a liquid crystal having a LED light source or an OLED; however, the present inventive concepts are not limited thereto. The display module 560 functions as an output device displaying an image such as a character, a number, a picture, or the like, with color.

The touch panel module 570 may provide a touch input to the AP 510 alone or on the display module 560.

The mobile device 500 is described as a mobile communication device, but the mobile device may function as a smart card by adding or subtracting constituent elements.

The mobile device 500 may be connected to an external communication device through a separate interface. The communication device can be a digital versatile disc (DVD) player, a computer, a set top box (STB), a game machine, a digital camcorder, or the like.

The power module 580 performs power management of the mobile device 500. When a PMIC scheme is applied to a SoC, power saving of the mobile device 500 is accomplished. The power module 580 may include a LCCD 184 and a battery 582. The power module 580 is connected to each of the AP 510, the memory device 520, the storage device 530, the communication module 540, the camera module 550, the display module 560, and the touch panel module 570

The camera module 550 includes a camera image processor (CIS) and is connected to the AP 510.

Although not illustrated in the drawing, the mobile device 500 may include another application chipset or another mobile DRAM.

Figure 19:
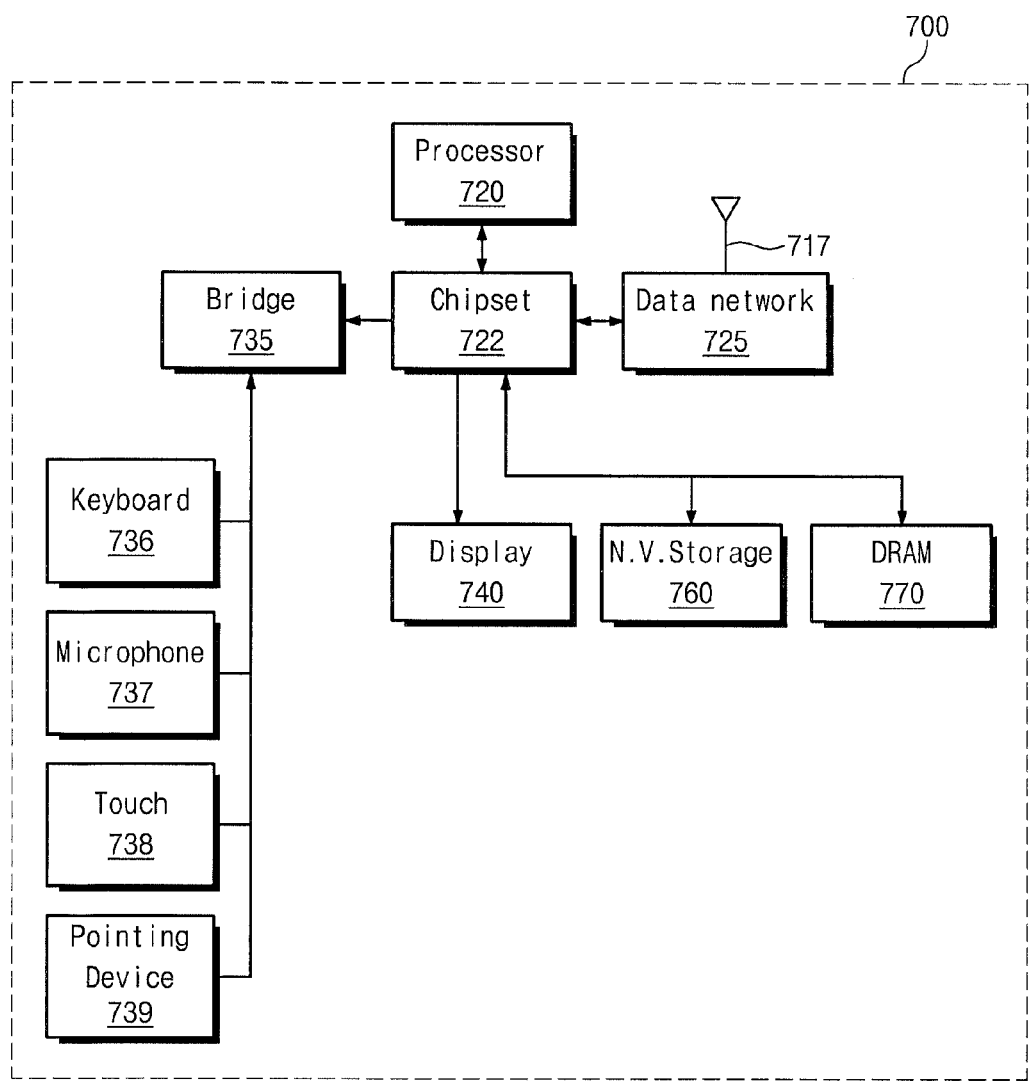
FIG. 19 is a block diagram illustrating an example embodiment of the memory system of the present inventive concepts applied to a computing device.

FIG. 19 is a block diagram illustrating an example embodiment of the memory system of the present inventive concepts applied to a computing device 700.

Referring to FIG. 19, the computing device 700 may include a processor 720, a chipset 722, a data network 725, a bridge 735, a display 740, a storage 760, a DRAM 770, a keyboard 736, a microphone 737, a touch panel 738 and a pointing device 739.

The DRAM 770 may include the bad page listing unit 210 as illustrated in connection with FIG. 1. The chipset 722 may include the bad page managing unit 110 as illustrated in connection with FIG. 2. The chipset 722 receives bad page information indicating a page address of a failed memory cell from the DRAM 770 when a system is powered up to generate a lookup table. The chipset 722 remaps bad pages of the DRAM 770 for a latency overhead hidden function of the DRAM 770 according to the generated lookup table in parallel with a precharge operation of the DRAM 770 being performed in a normal operation section. Thus, performance of the computing device may be improved or a decrease in cost may be realized.

The chipset 722 can apply a command, an address, data or control signals to the DRAM 770.

The processor 720 functions as a host and controls an overall operation of the computing device 700.

A host interface between the processor 720 and the chipset 722 includes various protocols to perform a data communication. The chipset 722 may be configured to communicate with a host or an external device through at least one among various interface protocols such as a USB (universal serial bus) protocol, a MMC (multimedia card) protocol, a PCI (peripheral component interconnection) protocol, a PCI-E (PCI-express) protocol, an ATA (advanced technology attachment) protocol, a serial-ATA protocol, a parallel-ATA protocol, a SCSI (small computer small interface) protocol, an ESDI (enhanced small disk interface) protocol, and an IDE (integrated drive electronics) protocol, or the like.

The device of FIG. 19 may be provided as one of various constituent elements of electronic devices, for example, a computer, an ultra mobile PC (UMPC), a workstation, a netbook, a personal digital assistants (PDA), a portable computer, a web tablet, a tablet computer, a wireless phone, a mobile phone, a smart phone, an e-book, a portable multimedia player (PMP), a portable game machine, a navigation device, a black box, a digital camera, a digital multimedia broadcasting (DMB) player, a three dimensional television, a smart television, a digital audio recorder, a digital audio player, a digital picture recorder, a digital picture player, a digital video recorder, a digital video player, a storage included in a data center, a device that may transmit and receive information in a wireless environment, one of various electronic devices included in a home network, one of various electronic devices constituting a computer network, one of various electronic devices included in a telematics network, and one of various constituent elements included in a RFID device or a computing system, or the like.

Figure 20:
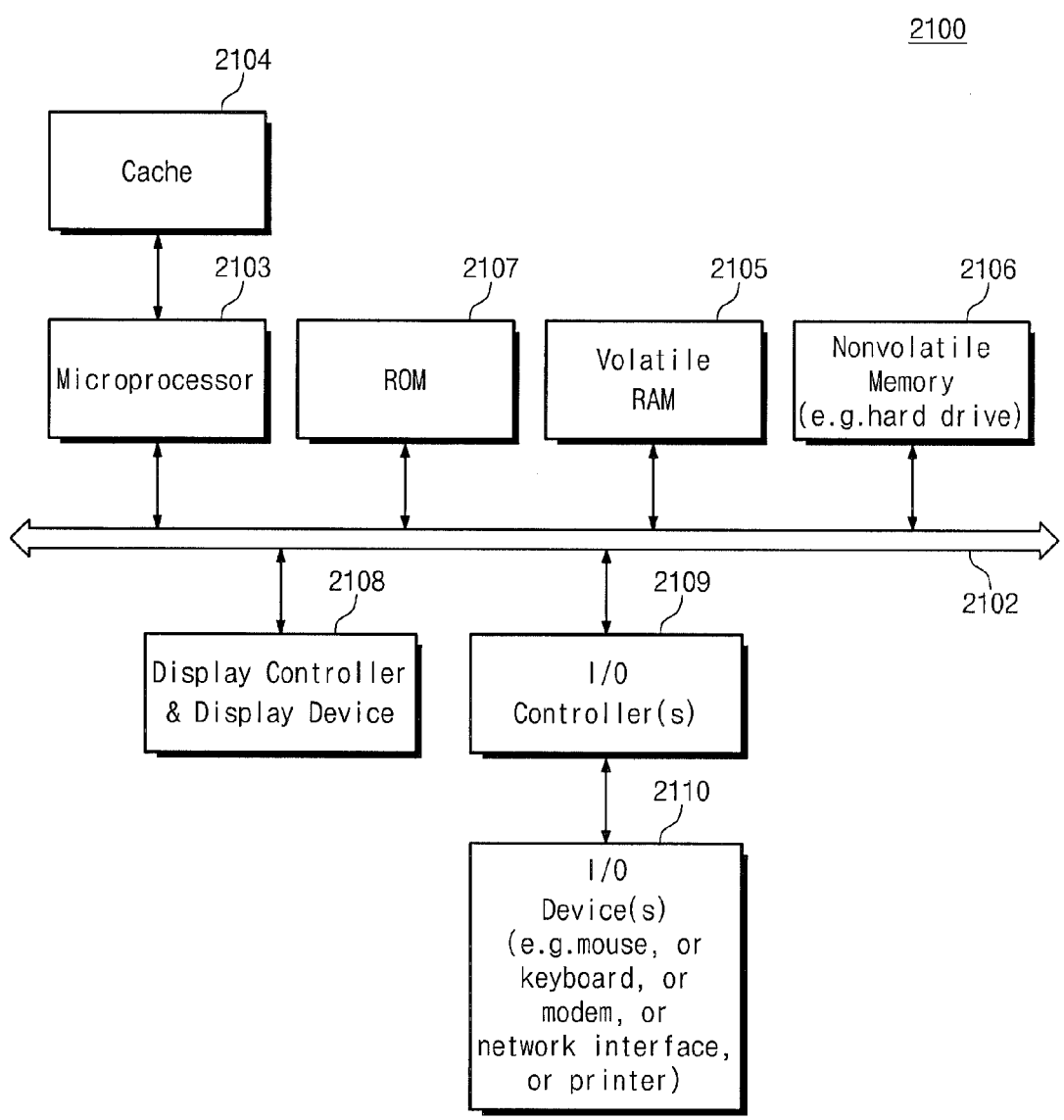
FIG. 20 is a block diagram illustrating an example embodiment of the memory system of the present inventive concepts applied to a digital processing system.

FIG. 20 is a block diagram illustrating an example embodiment of the memory system of the present inventive concepts applied to a digital processing system 2100.

Referring to FIG. 20, the digital processing system 2100 may include a microprocessor 2103, a ROM 2107, a volatile RAM 2105, a nonvolatile memory 2106, for example a hard drive, a display controller and display device 2108, an I/O controller(s) 2109, an I/O device 2110, for example, a mouse, a keyboard, a modem, a network interface, a printer, or the like, a cache 2104 and a bus 2102.

The volatile RAM 2105 may include a bad page listing unit similar to the bad page listing unit 210 as illustrated in connection with FIG. 1. The microprocessor 2103 that may function as an application processor may include a bad page managing unit similar to the bad page managing unit 110 as illustrated in connection with FIG. 2. When a system is powered up, the microprocessor 2103 receives bad page information indicating a page address of a failed memory cell from the DRAM 770 in order to generate a lookup table. The microprocessor 2103 remaps bad pages of the volatile RAM 2105 for a latency overhead hidden function of the DRAM according to the generated lookup table in parallel with a precharge operation of the DRAM being performed in a normal operation section. Thus, performance of the digital processing system 2100 may be improved.

The microprocessor 2103 controls an overall operation of the digital processing system 2100 according to the program previously set.

The volatile RAM 2105 is connected to the microprocessor 2103 through the bus 2102 and may function as a buffer memory or a main memory of the microprocessor 2103.

The digital processing system 2100 may be connected to an external communication device through a separate interface. The communication device may be a digital versatile disc (DVD) player, a computer, a set top box (STB), a game machine, a digital camcorder, or the like.

The volatile RAM 2105 chip or the nonvolatile memory 2106 chip may be mounted using various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP), or the like.

The nonvolatile memory 2106 may store data information having various types of data such as a text, a graphic, a software code, or the like.

The nonvolatile memory 2106 may include an electrically erasable programmable read-only memory (EEPROM), a flash memory, a magnetic random access memory (MRAM), a spin-transfer torque MRAM, a conductive bridging RAM (CBRAM), a ferroelectric RAM (FeRAM), a phase change RAM (PRAM) which is called an ovonic unified memory (OUM), a resistive RAM (RRAM), a nanotube RRAM, a polymer RAM (PoRAM), a nanotube floating gate memory (NFGM), a holographic memory, a molecular electronics memory device, or an insulator resistance change memory, or the like.

According to the present inventive concepts, since a DRAM includes only a bad page listing unit, an overhead of a chip size is reduced. A latency overhead hidden function is accomplished by a parallel controlling operation of the DRAM. That is, the latency overhead hidden function is accomplished by performing a remapping operation in parallel with a normal operation of a scheduler.

The above-disclosed subject matter is to be considered illustrative, and not restrictive, and the appended claims are intended to cover all such modifications, enhancements, and other embodiments, which fall within the true spirit and scope of the inventive concepts. Thus, to the maximum extent allowed by law, the scope of the inventive concepts is to be determined by the broadest permissible interpretation of the following claims and their equivalents, and shall not be restricted or limited by the foregoing detailed description.

What is claimed is:

1. A bad page management method of a DRAM comprising:
    receiving bad page information indicating a page address of a failed memory cell from a DRAM in response to a system being powered up;
    providing a lookup table on the basis of the received bad page information; and
    remapping bad pages of the DRAM according to the provided lookup table in parallel with a precharge operation of the DRAM performed in a normal operation of a memory controller.

2. The bad page management method of claim 1, wherein the bad page information comprises a defective row address of the DRAM.

3. The bad page management method of claim 1, wherein when the remapping operation is performed, when an input address coincides with an address in the lookup table which is indicated as a defective address in the lookup table, a remapping address is obtained from the lookup table and is output as an output address of the memory controller, and
    wherein when an input address does not coincide with an address which is indicated as a defective address in the lookup table, the input address is output as the output address of the memory controller.

4. The bad page management method of claim 3, wherein the remapping address indicates an address of a spare page to be accessed instead of the bad page.

5. The bad page management method of claim 3, wherein the lookup table has a set overflow bit at every bad page and a memory row size of the lookup table is determined by a set associative value.

6. The bad page management method of claim 5, wherein in the lookup table, in the case that the number of occurrence of the bad pages exceeds the set associative value, a next row confirm flag bit is provided for indicating that the number of bad pages exceeds a set associative value by a row unit.

7. The bad page management method of claim 5, wherein the lookup table is comprises a SRAM or a register file.

8. A memory controller comprising:
    a bad page management unit,
    wherein the bad page management unit comprises:
    a scheduling unit generating a command and an address to access a memory; and
    a page remapper which operates in parallel with a normal operation of the scheduling unit and receives bad page information indicating a page address of a failed memory cell from the memory in a system boot up operation to remap bad pages of the memory.

9. The memory controller of claim 8, wherein the page remapper comprises:
    a lookup table for storing and managing the bad page information;
    an address generator receiving an input address to generate an internal address for an address remapping;
    a comparing unit comparing a part of the internal address with an address being output from the lookup table; and
    a hit/miss logic selectively outputting a remapping address or the input address according to a comparison output of the comparing unit.

10. The memory controller of claim 9, wherein the hit/miss logic outputs the remapping address as an output address when the comparison output of the comparing unit indicates a bad page hit, and
    wherein the input address bypasses to the output when the comparison output of the comparing unit indicates a bad page miss.

11. The memory controller of claim 10, wherein the remapping address or the input address is provided to the scheduling unit.

12. The memory controller of claim 10, wherein the lookup table has a set overflow bit at every bad page.

13. The memory controller of claim 10, wherein a memory size of the lookup table is determined according to the number of spare pages being set.

14. The memory controller of claim 12, wherein a memory row size of the lookup table is determined according to a set associative value.

15. The memory controller of claim 14, wherein, when the number of bad pages occurred exceeds a set associative value, the lookup table further comprises a next row confirm flag bit for indicating that the number of bad pages exceeds the set associative value by a row unit.

16. An SoC comprising:
    a memory comprising a memory cell array and a bad page listing unit storing bad page information indicating a page address of a failed memory cell in the memory cell array; and
    a memory controller comprising a bad page management unit comprising a scheduling unit generating a command and an address to access the memory and a page remapper which receives the bad page information from the bad page listing unit in a system initialization operation to remap bad pages of the memory,
    wherein the page remapper operates in parallel with the scheduling unit in a normal operation of the scheduling unit.

17. The SoC of claim 16, wherein the bad page listing unit of the memory comprises at least one of a nonvolatile memory, an antifuse circuit, and an e-fuse circuit.

18. The SoC of claim 16, wherein, when the memory controller controls a precharge operation of the memory, the page remapper performs a remapping operation on bad pages of the memory in parallel with the precharge operation of the memory.

19. The SoC of claim 18, wherein the remapping operation is finished before an active operation of the memory begins.

20. The SoC of claim 16, wherein the page remapper comprises:
- a lookup table for storing and managing the bad page information;
- an address generator receiving an input address to generate an internal address for an address remapping;
- a comparing unit comparing a part of the internal address with an address being output from the lookup table; and
- a hit/miss logic selectively outputting one of a remapping address and the input address according to a comparison output of the comparing unit.

* * * * *